(12) United States Patent
Ponton

(10) Patent No.: US 9,077,511 B2
(45) Date of Patent: *Jul. 7, 2015

(54) PHASE INTERPOLATOR

(71) Applicant: Intel Mobile Communications GmbH, Neubiberg (DE)

(72) Inventor: Davide Ponton, Warmbad-Villach (AT)

(73) Assignee: Intel Mobile Communications GmbH, Neubiberg (DE)

( * ) Notice: Subject to any disclaimer, the term of this patent is extended or adjusted under 35 U.S.C. 154(b) by 102 days.

This patent is subject to a terminal disclaimer.

(21) Appl. No.: 13/873,826

(22) Filed: Apr. 30, 2013

(65) Prior Publication Data

US 2014/0321515 A1    Oct. 30, 2014

(51) Int. Cl.
| | |
|---|---|
| H04L 7/02 | (2006.01) |
| H03H 11/20 | (2006.01) |
| H03D 3/00 | (2006.01) |
| H04L 27/00 | (2006.01) |
| H03M 3/00 | (2006.01) |

(52) U.S. Cl.
CPC .................. *H04L 7/02* (2013.01); *H03H 11/20* (2013.01); *H03D 3/00* (2013.01); *H04L 27/00* (2013.01); *H03M 3/394* (2013.01)

(58) Field of Classification Search
USPC ........... 375/354, 375, 373, 376, 371; 327/337
See application file for complete search history.

(56) References Cited

U.S. PATENT DOCUMENTS

| | | | |
|---|---|---|---|
| 8,040,266 B2 * | 10/2011 | Thiagarajan et al. | 341/143 |
| 2014/0072077 A1 * | 3/2014 | Cheng et al. | 375/303 |

* cited by examiner

*Primary Examiner* — Vineeta Panwalkar
(74) *Attorney, Agent, or Firm* — Eschweiler & Associates, LLC

(57) ABSTRACT

A phase interpolator is provided. The phase interpolator includes a plurality of capacitors, a first input for a clock signal, a second input for a phase shifted clock signal, a reference input for a reference signal, and an output. The phase interpolator is configured to provide at its output an interpolated, modulated phase information signal by switching, dependent on a modulation information, a first number of the capacitors between the first input and the output, a second number of the capacitors between the second input and the output, and a third number of the capacitors to the reference input.

27 Claims, 19 Drawing Sheets

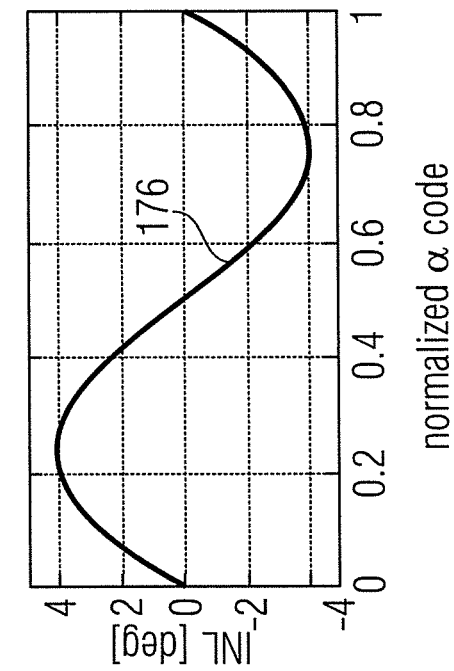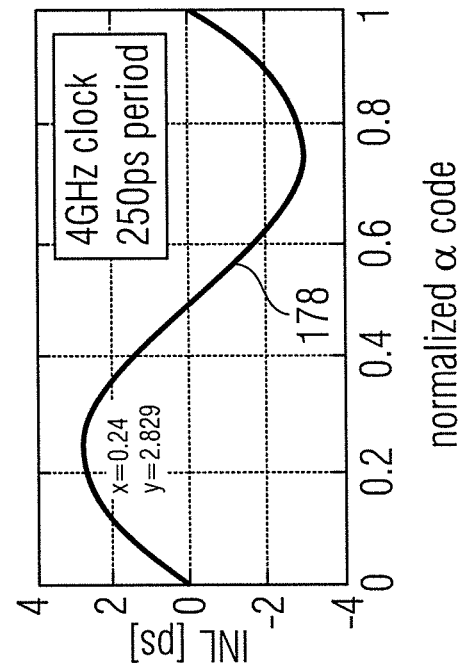
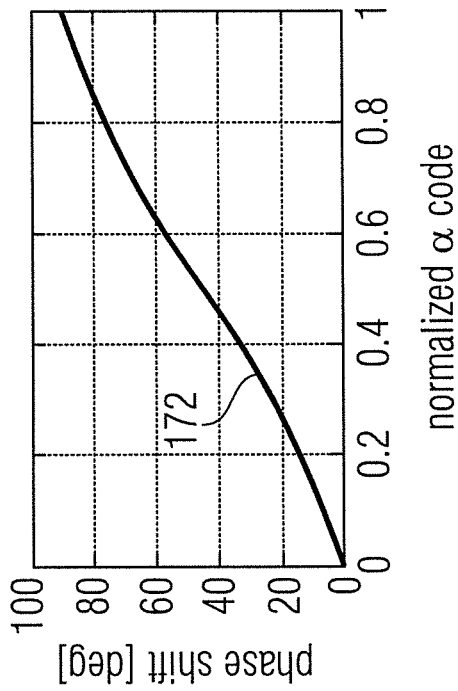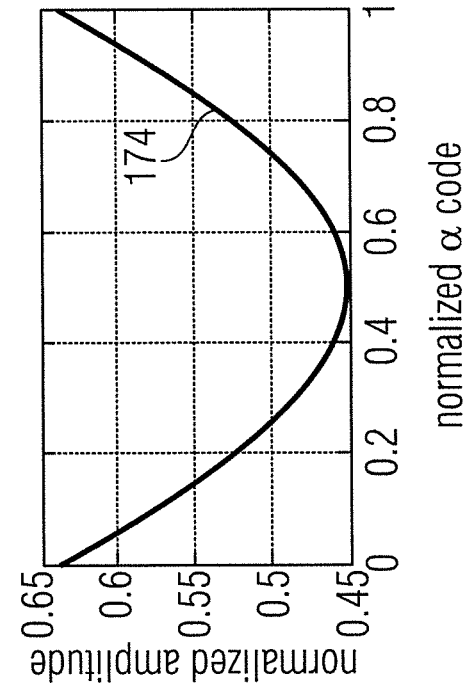
FIG 6B
FIG 6C

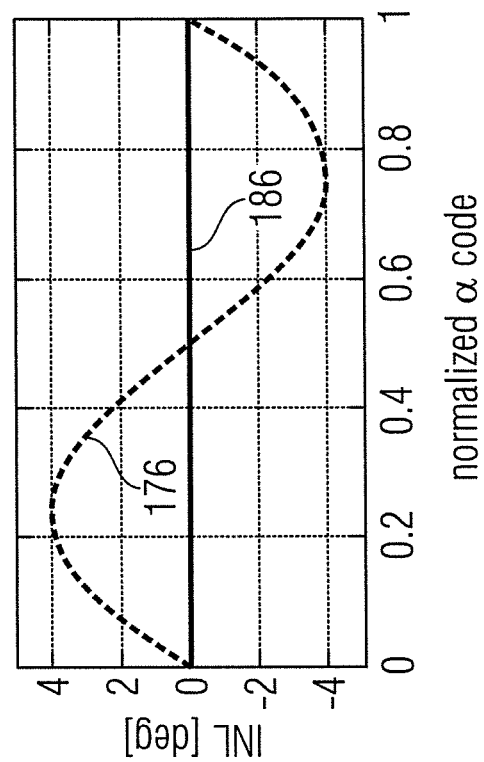
FIG 9C
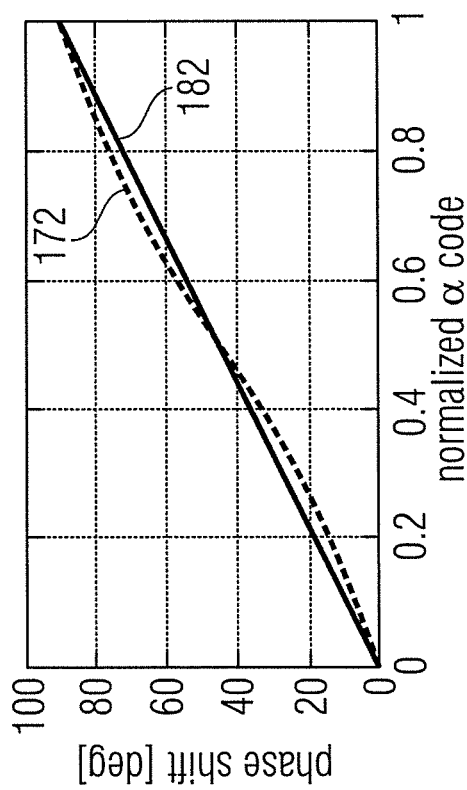
FIG 9B
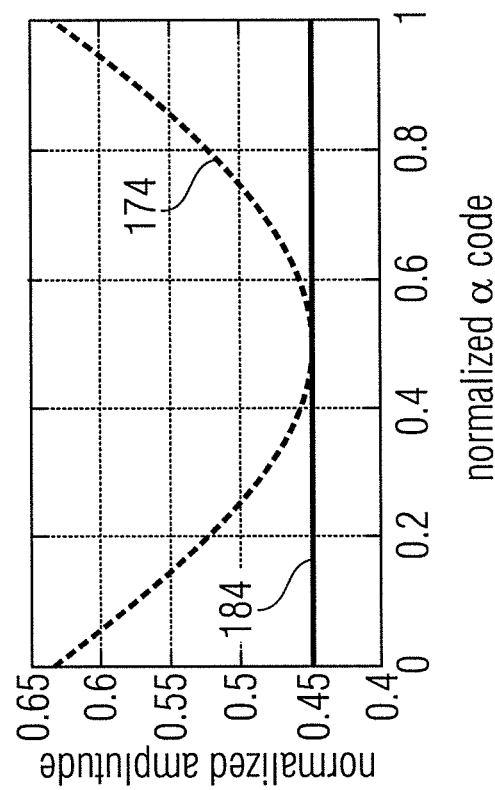

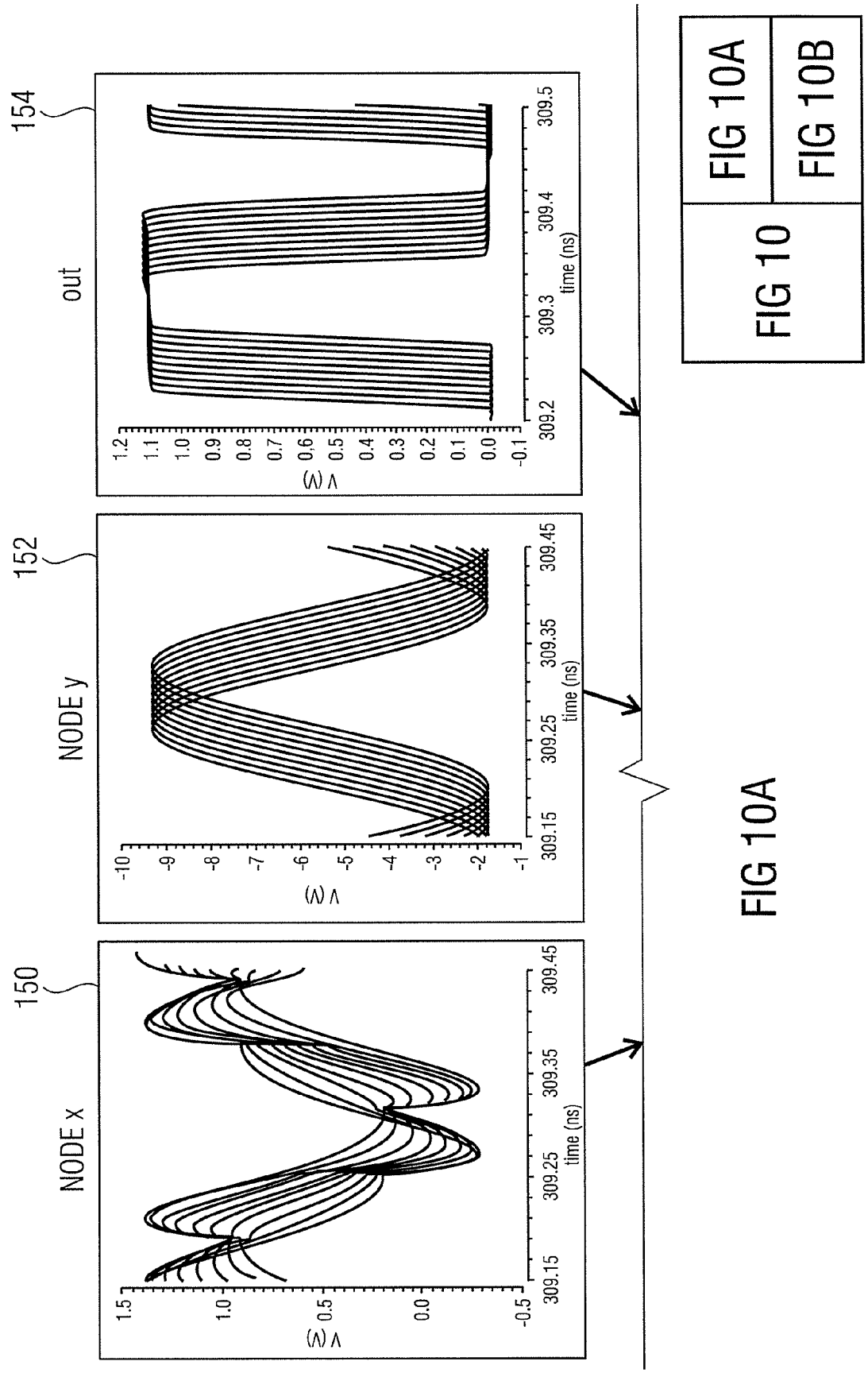

300

302

Providing an interpolated, modulated phase information signal by switching, dependent from a modulation information, a first number of the capacitors between the first input and the output, a second number of the capacitors between the second input and the output and a third number of the capacitors to the reference input

PHASE INTERPOLATOR

BACKGROUND

Digital-to-time converters (DTC) convert digital information to a time delay or a phase shift of the output signal. Therefore, digital-to-time converters can be used to generate a frequency- or phase-modulated clock in a polar transmitter.

Polar mode transmitters have recently become attractive thanks to a higher power efficiency compared to standard IQ (I=in-phase; Q=quadrature) transmitters. In the polar mode, the amplitude modulation is achieved by means of a DAC (DAC=digital-to-analog converter) or RFDAC (RFDAC=radio frequency digital-to-analog converter), while the phase information is delivered by modulating an input clock.

For low baseband frequencies, e.g., for GSM (GSM=global system for mobile communications) and UMTS (UMTS=universal mobile telecommunications system) standards, the modulation can be achieved by directly modulating a PLL (PLL=phase-locked loop) signal. For modern standards, such as LTE (LTE=long term evolution), the signal bandwidth is increased to 40 MHz and beyond (by carrier aggregation), making the PLL modulation ineffective. As a consequence, phase/frequency modulation is achieved by modulating a fixed frequency signal coming from the PLL by means of a DTC.

DTC integral/differential linearity is a key figure of merit for the performance of the converter. Large integral non-linearity generates harmonics in the output spectrum, while large differential non-linearity causes, in turn, a high noise floor. Identifying and reducing/eliminating sources of non-linearity in the DTC is therefore mandatory in order to achieve a clean modulated clock for the polar transmitter.

SUMMARY

A phase interpolator is provided. The phase interpolator comprises a plurality of capacitors, a first input configured to receive a clock signal, a second input configured to receive a phase shifted clock signal, a reference input configured to receive a reference signal, and an output. The phase interpolator is configured to provide at its output an interpolated, modulated phase information signal by switching, dependent on a modulation information, a first number of the capacitors between the first input and the output, a second number of the capacitors between the second input and the output, and a third number of the capacitors to the reference input.

A digital-to-time converter is provided. The digital-to-time converter comprises a clock signal provider, a phase interpolator and a low-pass filter. The clock signal provider is configured to provide a clock signal and a phase shifted clock signal. The phase interpolator comprises a plurality of capacitors, a first input configured to receive the clock signal, a second input configured to receive the phase shifted clock signal, a reference input configured to receive a reference signal, and an output. The phase interpolator is configured to provide an interpolated, modulated phase information signal by switching, dependent on a modulation information, a first number of the capacitors between the first input and the output, a second number of the capacitors between the second input and the output, and a third number of the capacitors to the reference input. The low-pass filter is configured to low-pass filter the interpolated, modulated phase information signal in order to obtain a modulated phase signal.

A mobile communication device is provided. The mobile communication device comprises an RF (RF=radio frequency) circuit configured to provide or receive RF signals, and an antenna port coupled to the RF circuit. The RF circuit comprises a phase interpolator comprising a plurality of capacitors, a first input configured to receive a clock signal, a second input configured to receive a phase shifted clock signal, a reference input configured to receive a reference signal, and an output. The phase interpolator is configured to provide an interpolated, modulated phase information signal by switching, dependent on a modulation information, a first number of the capacitors between the first input and the output, a second number of the capacitors between the second input and the output, and a third number of the capacitors to the reference input.

A method for operating a phase interpolator comprising a plurality of capacitors, a first input configured to receive a clock signal, a second input configured to receive a phase shifted clock signal, a reference input configured to receive a reference signal, and an output is provided. The method comprises providing an interpolated, modulated phase information signal by switching, dependent on a modulation information, a first number of the capacitors between the first input and the output, a second number of the capacitors between the second input and the output, and a third number of the capacitors to the reference input.

BRIEF DESCRIPTION OF THE DRAWINGS

FIG. 6B shows a diagram of the phase shift in degrees of the fundamental of the interpolated, modulated phase information signal plotted over the normalized modulation code, and a diagram of the normalized amplitude of the fundamental of the interpolated, modulated phase information signal plotted over the normalized modulation code assuming orthogonal clocks;

FIG. 6C shows a diagram of the integral non-linearity in ps of the phase shift of the fundamental of the interpolated, modulated phase information signal plotted over the normalized modulation code, and a diagram of the integral non-linearity in ps of the phase shift of the fundamental of the interpolated, modulated phase information signal plotted over the normalized modulation code assuming orthogonal clocks at 4 GHz;

FIG. 9B shows a diagram of the phase shift in degrees of the fundamental of the interpolated, modulated phase information signal plotted over the normalized modulation code, and a diagram of the normalized amplitude of the fundamental of the interpolated, modulated phase information signal plotted over the normalized modulation code assuming orthogonal clocks;

FIG. 9C shows a diagram of the integral non-linearity in degrees of the phase shift of the fundamental of the interpolated, modulated phase information signal plotted over the normalized modulation code;

FIG. 16 shows a flowchart of a method for operating a phase interpolator.

DETAILED DESCRIPTION

Figure 1:
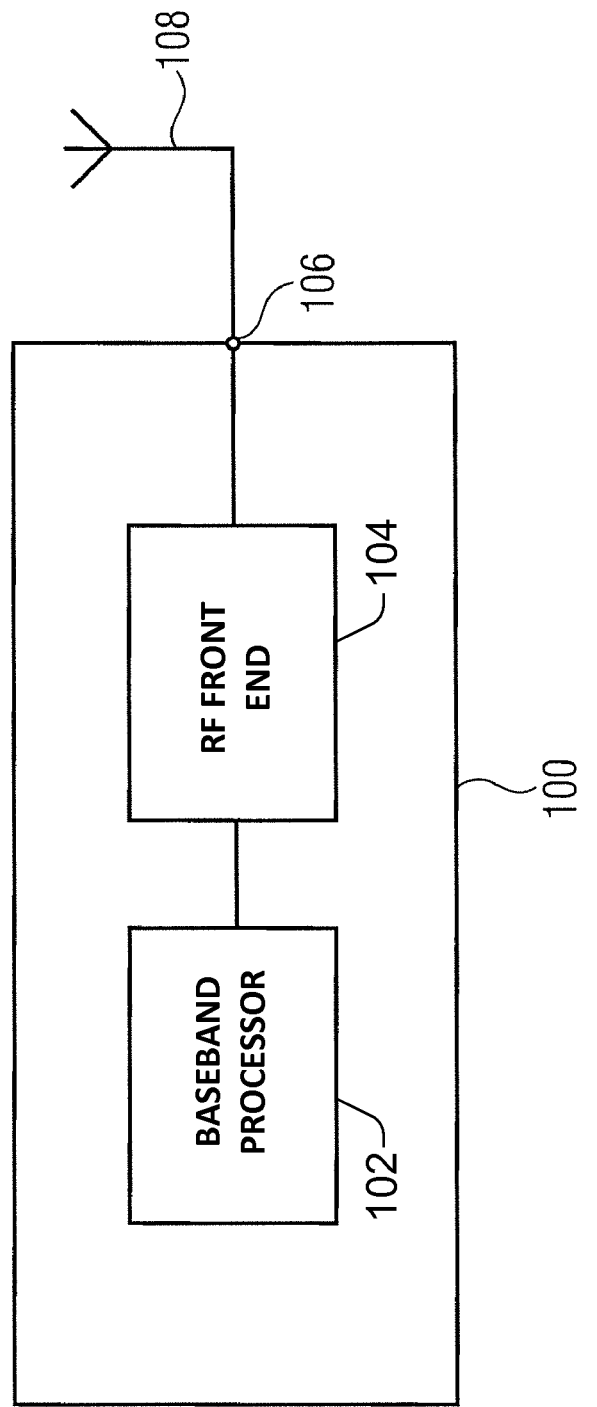
FIG. 1 shows a block diagram of an example mobile communication device.

In the following description, equal or equivalent elements or elements with equal or equivalent functionality are denoted in the following description by equal or equivalent reference numerals. It is noted that the following description is made with respect to examples using orthogonal phase shifts or orthogonal clocks at 4 GHz. However, other examples may use other non-orthogonal phase shifts or clocks. Also the clocks may have frequencies different from 4 GHz, e.g., higher or lower frequencies.

FIG. 1 shows a block diagram of an example mobile communication device 100 comprising a digital baseband processor 102, an RF front end 104 coupled to the baseband processor 102 and to an antenna port 106. The antenna port 106 is provided to allow connection of an antenna 108 to the mobile communication device 100. The baseband processor 102 generates signals to be transmitted via the antenna 108 which are forwarded to the RF front end 104 for generating a transmit signal output to the antenna port 106 for transmission via the antenna 108. The RF front end 104 may also receive signals via the antenna port 106 from the antenna 108 and provide respective signals to the baseband processor 102 for processing the received signals.

The phase modulator described in further detail below may be implemented in the RF frontend 104 of the mobile communication device. Furthermore, the phase interpolator described in further detail below may be used to implement or realize a digital-to-time converter (DTC) of the RF frontend 104 of the mobile communication device 100.

The mobile communication device 100 may be a portable mobile communication device and may be configured to perform a voice and/or data communication according to a mobile communication standard with other communication devices, like other mobile communication devices or base stations of a mobile communication network. Mobile communication devices may comprise a mobile handset, such as a mobile phone or a smart phone, a tablet PC, a broadband modem, a laptop, a notebook, a router, a switch, a repeater or a PC. Also, the mobile communication device 100 may be a base station of a communication network.

Figure 2:
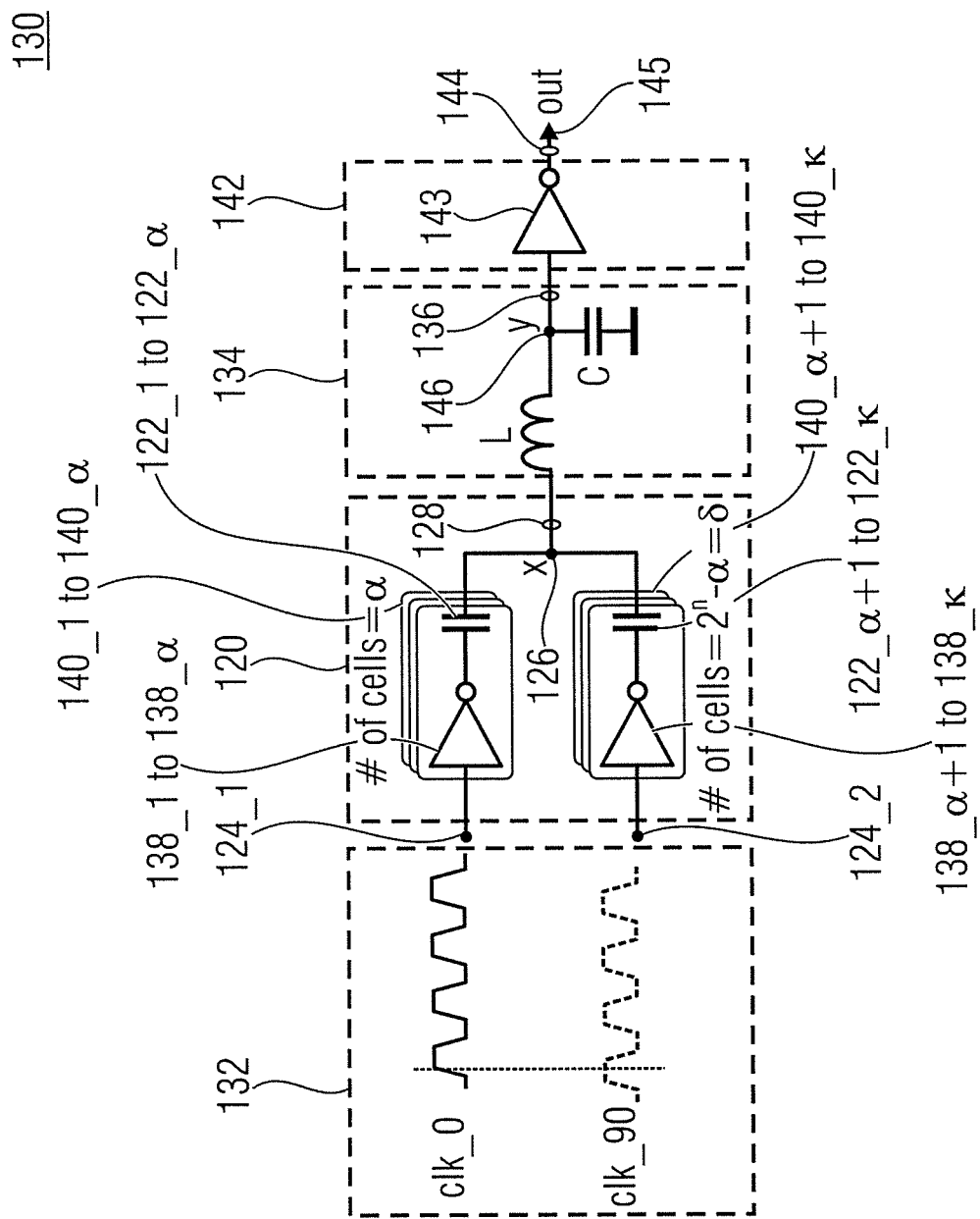
FIG. 2 shows a block diagram of a digital-to-time converter.

FIG. 2 shows a block diagram of an example digital-to-time converter 130. The digital-to-time converter 130 can comprise a clock signal provider 132, a low-pass filter 134, a phase interpolator 120 and an analog-to-digital converter 142. The clock signal provider 132 can be configured to provide a clock signal clk_0 and a phase shift clock signal clk_90. The phase interpolator 120 can comprise a plurality of capacitors $122\_1$ to $122\_\kappa$, a first input $124\_1$ for a clock signal clk_0, a second input $124\_2$ for a phase-shifted clock signal clk_90 and an output 126. The phase interpolator 120 can be configured to provide an interpolated, modulated phase information signal 128 by switching, dependent on a modulation information, a first number $\alpha$ of the capacitors $122\_1$ to $122\_\alpha$ between the first input $124\_1$ and the output 126 and a second number $\delta$ of the capacitors $122\_\alpha+1$ to $122\_\kappa$ between the second input $124\_2$ and the output 126 ($\delta=\kappa-\alpha$). The low-pass filter 134 can be configured to low-pass filter the interpolated, modulated phase information signal 128 in order to obtain a modulated phase signal 136. The analog-to-digital converter 142 can be configured to convert the modulated phase signal 136 into a modulated clock signal 144.

The phase interpolator 120 can comprise $\kappa$ capacitors $122\_1$ to $122\_\kappa$, wherein $\kappa$ is a natural number greater than or equal to 2 ($\kappa \geq 2$). Moreover, the phase interpolator 120 can comprise $K=2^n$ capacitors $122\_1$ to $122\_2^n$, wherein n is a natural number greater than or equal to one ($n \geq 1$). For example, the phase interpolator 120 can comprise 2, 4, 8, 16, 32, 64, 128, 256, 512, 1024, 2048, 4096, 8192 or even more capacitors $122\_1$ to $122\_\kappa$.

Thus, the phase interpolator 120 can be configured to switch, dependent on the modulation information, a capacitors $122\_1$ to $122\_\alpha$ of the plurality of capacitors $122\_1$ to $122\_\kappa$ between the first input $124\_1$ and the output 126, and $\delta=\kappa-\alpha$ (or $\delta=2^n-\alpha$) capacitors $122\_\alpha+1$ to $122\_\kappa$ of the plurality of capacitors $122\_1$ to $122\_\kappa$ between the second input $124\_2$ and the output 126.

As shown in FIG. 2, the phase interpolator 120 can comprise a plurality of capacitor cells $140\_1$ to $140\_\kappa$, wherein each capacitor cell of the plurality of capacitor cells $140\_1$ to $140\_\kappa$ can comprise one inverter of a plurality of inverters $138\_1$ to $138\_\kappa$ and one capacitor of the plurality of capacitors $122\_1$ to $122\_\kappa$ connected in series. Thereby, the phase interpolator 120 can be configured to connect, dependent on the modulation information, each capacitor cell of the plurality of capacitor cells 140_1 to 140_κ either between the first input 124_1 and the output 126 or between the second input 124_2 and the output 126. In other words, the phase interpolator 120 can be configured to switch, dependent on the modulation information, a first number α of the capacitor cells 140_1 to 140_α between the first input 124_1 and the output 126 and a second number δ of the capacitor cells 140_α+1 to 140_κ between the second input 124_2 and the output 126 (δ=κ−α).

Note that the modulation information may indicate a desired phase or phase shift of the modulated phase signal 136 and/or modulated clock signal 144. Further, the modulation information may indicate the number α of capacitors to be switched between the first input 124_1 and the output 126 and/or the number δ of capacitors to be switched between the second input 124_2 and the output, in order to achieve the desired phase or phase shift of the modulated phase signal 136 and/or modulated clock signal 144.

Subsequently it is assumed that in one embodiment the modulation information is a digital code having n bits indicating the number α of capacitors to be connected between the first input 124_1 and the output 126. This digital code is referred to as modulation code α in the following.

In other words, referring to FIG. 2, an input clock clk_0 and a phase shifted clock clk_90 (e.g., a 90 degree shifted clock signal) can be interpolated by a capacitor network. The information for the phase is located in the amplitude of the signal 128 present at the output 126 (node x) of the phase interpolator 120. The phase information can be reconstructed by filtering the fundamental frequency by a low-pass filter 134 (e.g., a passive LC filter). The phase of this signal can be changed by varying the amount (or number) of unit capacitors connected in turn to the clock signal clk_0 or the phase shifted clock signal clk_90. Finally, an analog-to-digital converter 142 (e.g., a CMOS buffer) can convert the sine wave at the output 146 (node y) of the low-pass filter 134 to a digital signal 144.

Given n bits digital-to-time converter (i.e., $2^n$), the total number of unit capacitors α is the amount (or number) of unit capacitors 122_1 to 122_α connected to the clock signal clk_0 (e.g., a 0 degree signal) and δ=$2^n$−α is the amount (or number) of unit capacitors 122_α+1 to 122_κ connected to the phase shifted clock signal clk_90 (e.g., a 90 degree signal). By varying the input n bits digital code α from 0 to $2^n$ the phase of the output signal spans between the phases of the clock signal clk_0 and the phase shifted clock signal clk_90, for example, from 0 to 90 degrees.

Figure 3:
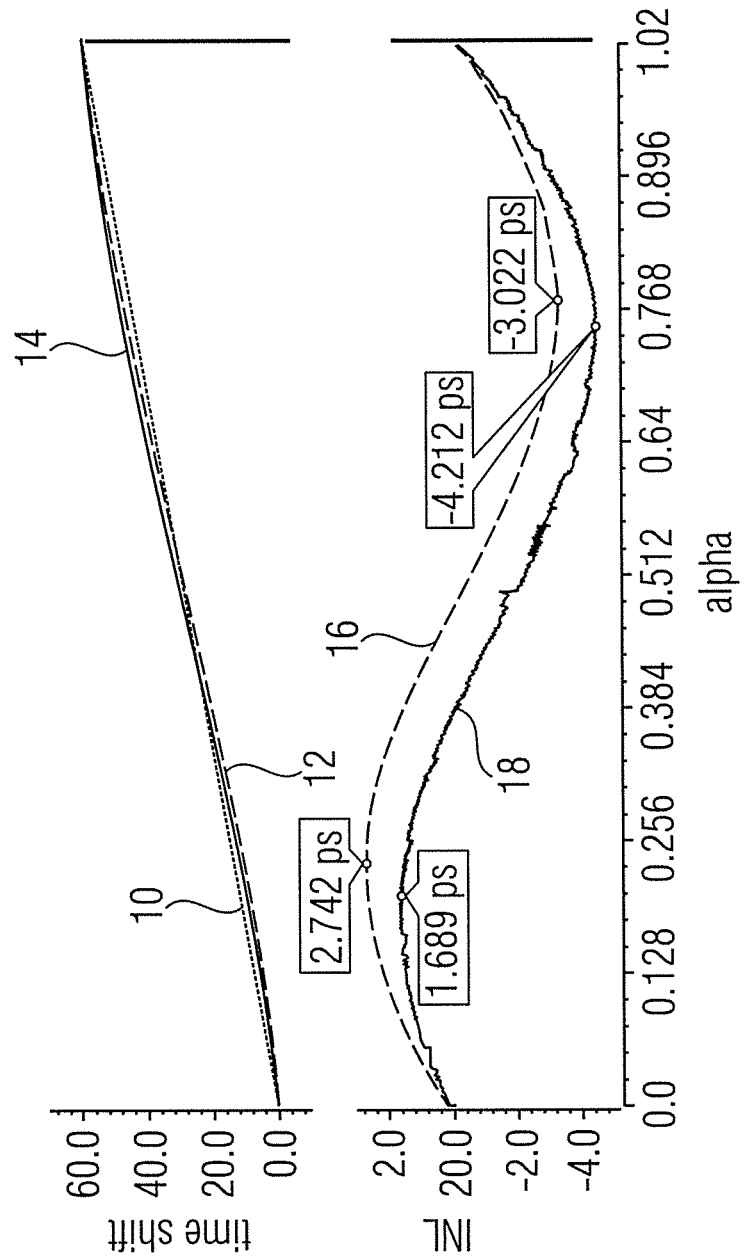
FIG. 3 shows a diagram of time-shifts and integral non-linearities of signals present at the output of the phase interpolator and at the output of the low-pass filter plotted versus the input data defining the number of capacitors connected between the first input and the output.

The resulting time/phase shift shows an integral non-linearity (INL), as will become clear from the discussion of FIG. 3.

FIG. 3 shows a diagram of time-shifts and integral non-linearities of signals present at the output 144 and at the output 146 plotted over the modulation code α. Thereby, the ordinate denotes the time shift in ps and the integral non-linearity (INL) in ps, where the abscissa denotes the modulation code α (i.e., the number α of capacitors in thousands connected between the first input 124_1 and the output 126). In other words, FIG. 3 shows a digital-to-time converter time-shift and integral non-linearity (INL) at node y and node out vs. α (based on a VerilogA model) assuming orthogonal clocks at 4 GHz.

More precisely, in FIG. 3 a first curve 10 indicates an ideal time shift as a reference, wherein a second curve 12 indicates the time shift of the modulated phase signal 136 present at the output 146 (node y) of the low-pass filter 134, and wherein a third curve 14 indicates the time shift of the modulated clock signal 144 present at the output 145 (node out) of the digital-to-time converter 130. Further, in FIG. 3 a fourth curve 16 indicates the integral non-linearity (INL) of the modulated phase signal 136 present at the output 146 (node y) of the low-pass filter 134, wherein a fifth curve 18 indicates the integral non-linearity (INL) of the modulated clock signal 144 present at the output 145 (node out) of the digital-to-time converter 130.

In other words, FIG. 3 reports the simulated time-shift and integral non-linearity (INL) for a digital-to-time converter 130 modelled with Verilog-A, featuring 4 GHz orthogonal input clocks, 10 bits resolution, segmented in 8 thermometer coded bits and 2 binary weighted bits. The large non-linearity at node y (indicated by the fourth curve 16) is additionally distorted by the analog-to-digital converter 142 (e.g., output buffer) (indicated by the fifth curve 18).

Subsequently, a novel phase interpolator 121 is described in FIG. 4 which is capable of reducing (or even eliminating) the above described non-linearities of the modulated phase signal 136 present at the output 146 (node y) of the low-pass filter 134 and the modulated clock signal 144 present at the output 145 (node out) of the digital-to-time converter 130.

Figure 4:
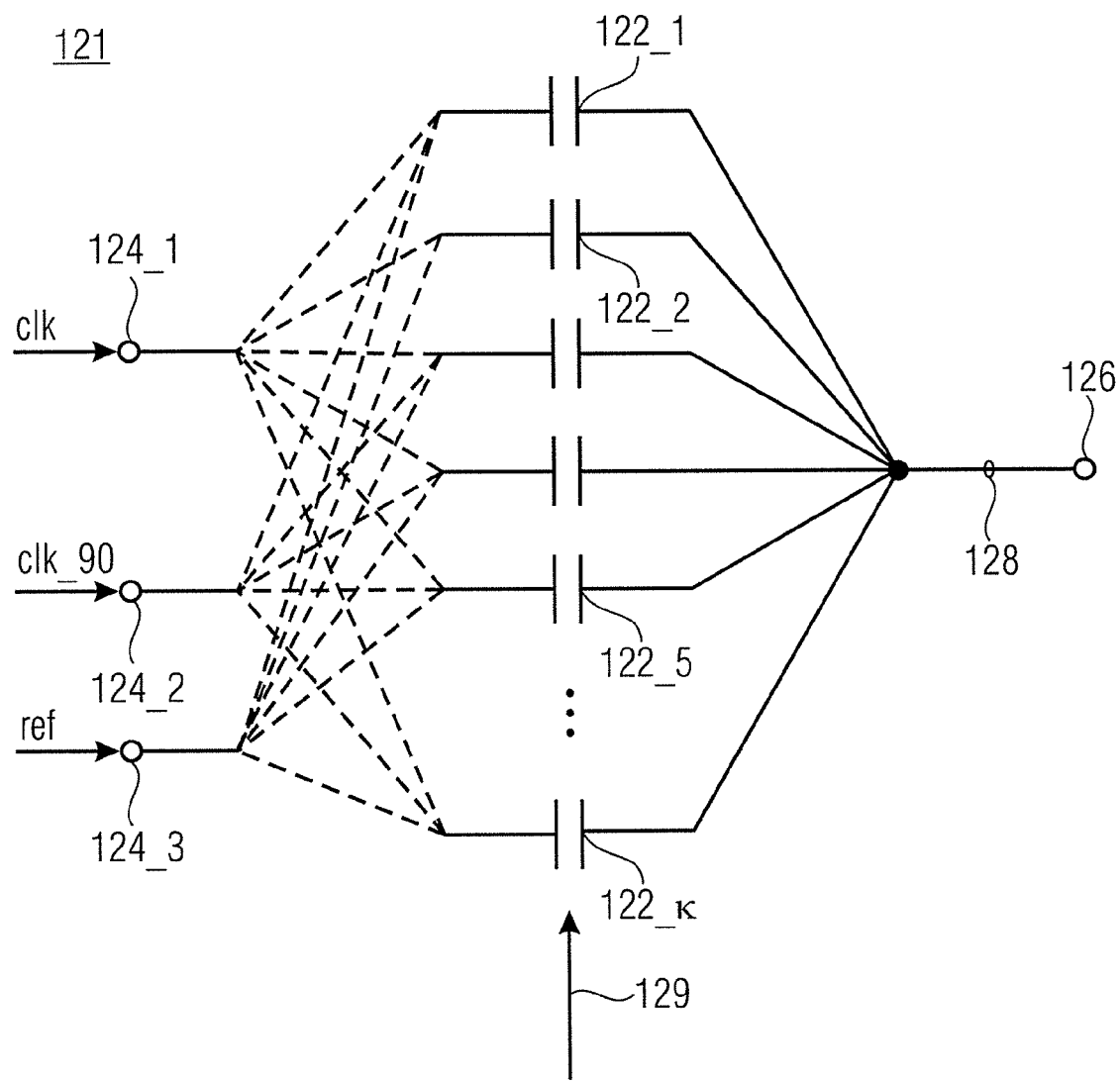
FIG. 4 shows a block diagram of a novel phase interpolator.

FIG. 4 shows a block diagram of the novel phase interpolator 121. The phase interpolator 121 comprises a plurality of capacitors 122_1 to 122_κ, a first input 124_1 for a clock signal clk_0, a second input 124_2 for a phase-shifted clock signal clk_90, a reference input 124_3 for a reference signal ref and an output 126. The phase interpolator 121 is configured to provide at its output an interpolated, modulated phase information signal 128 by switching, dependent on a modulation information 129, a first number γ of the capacitors 122_1 to 122_γ between the first input 124_1 and the output 126, a second number η of the capacitors 122_γ+1 to 122_β between the second input 124_2 and the output, and a third number ε of the capacitors 122_β+1 to 122_κ to the reference input 124_3.

As shown in FIG. 4, the phase interpolator 121 can be configured to switch the third number ε of the capacitors 122_β+1 to 122_κ between the reference input 124_1 and the output 126.

Note that the phase interpolator 121 can comprise κ capacitors 122_1 to 122_κ, wherein κ is a natural number greater than or equal to 2 (κ≥2). Moreover, the phase interpolator 121 can comprise κ=$2^n$ capacitors 122_1 to 122_$2^n$, wherein n is a natural number greater than or equal to one (n≥1). For example, the phase interpolator 121 can comprise 2, 4, 8, 16, 32, 64, 128, 256, 512, 1024, 2048, 4096, 8192 or even more capacitors 122_1 to 122_κ.

The first number γ of the capacitors 122_1 to 122_γ, the second number η of the capacitors 122_γ+1 to 122_β and the third number ε of the capacitors 122_β+1 to 122_κ can form the plurality of capacitors 122_1 to 122_κ. Thus, the sum of the first number γ of capacitors, the second number η of capacitors and the third number ε of capacitors can be equal to the plurality (or total number κ) of capacitors (κ=γ+η+ε).

Therefore, the phase interpolator 121 can be configured to connect, dependent on the modulation information, γ capacitors 122_1 to 122_γ of the plurality of capacitors 122_1 to 122_κ to the first input 124_1, to connect η capacitors 122_γ+1 to 122_β of the plurality of capacitors 122_1 to 122_κ to the second input 124_2, and to connect ε capacitors 122_β+1 to 122_κ of the plurality of capacitors 122_1 to 122_κ to the reference input 124_3, wherein γ can be a natural number greater than or equal to zero, wherein η can be a natural number greater than or equal to zero, and wherein ε can be a natural number greater than or equal to zero. In other words, the phase interpolator 121 can be configured to connect, dependent on the modulation information 129, each capacitor of the plurality of capacitors 122_1 to 122_κ either to the first input 124_1, to the second input 124_2 or to the reference input 124_3. In other words, the phase interpolator 121 can be configured to switch each capacitor of the plurality of capacitors 122_1 to 122_κ either between the first input 124_1 and the output 126, between the second input 124_2 and the output 126, or between the reference input 124_3 and the output 126.

Observe that the reference signal ref present at the reference input 124_3, in accordance with examples, is substantially constant during at least 3 (or 4, 5, 10, 20, 50, 100, 1000 or even more) periods of the clock signal clk_0 and/or the phase shifted clock signal clk_90. Further, the reference signal ref present at the reference input 124_3 may be a DC signal having no AC component in one embodiment. For example, the reference signal ref present at the reference input 124_3 may be a positive supply voltage Vdd (e.g., a positive supply voltage Vdd of the phase interpolator 121), a negative supply voltage Vcc (e.g., a negative supply voltage Vcc of the phase interpolator 121) or a ground potential (i.e., the third input 124_3 may be a ground terminal).

Naturally, it is also possible that the reference input 124_3 is a differential input and that the reference signal ref present at the differential reference input 124_3 is a differential signal having a first component (e.g., the positive supply voltage Vdd) and a second component (e.g., the negative supply voltage Vcc or ground potential). In that case the phase interpolator 121 may be configured to connect a first part $\epsilon_1$ of the third number $\epsilon$ of the capacitors to the first component of the differential reference signal and to connect a second part $\epsilon_2$ of the third number $\epsilon$ of the capacitors to the second component of the differential reference signal, wherein the first part $\epsilon_1$ and the second part $\epsilon_2$ form the third number $\epsilon$ of the capacitors, i.e. $\epsilon=\epsilon_1+\epsilon_2$. The first part $\epsilon_1$ and the second part $\epsilon_2$ may comprise the same number (or amount) of capacitors, i.e. $\epsilon_1=\epsilon_2=\epsilon/2$. In other words, the phase interpolator 121 may be configured to connect a first half $\epsilon_1$ of the third number $\epsilon$ of the capacitors to the first component of the differential reference signal and a second half $\epsilon_2$ of the third number $\epsilon$ of the capacitors to the second component of the differential reference signal.

The plurality of capacitors 122_1 to 122_κ may comprise the same capacitance value. Naturally, it is also possible that the plurality of capacitors 122_1 to 122_κ comprise different capacitance values. In that case, the phase interpolator 121 may be configured to connect the capacitors of the plurality of capacitors 122_1 to 122_κ to the respective input 124_1, 124_2 and 124_3 so as to provide the same modulation described by the current modulation information 129.

The phase interpolator 121 can be configured to control or regulate, in response to a change of the modulation information 129, the first number γ of the capacitors 122_1 to 122_γ which are switched between the first input 124_1 and the output 126, the second number η of the capacitors 122_γ+1 to 122_β which are switched between the second input 124_2 and the output 126 and the third number $\epsilon$ of the capacitors 122_β+1 to 122_κ which are connected to the reference input 124_3, such that the change of the modulation information 129 leads to a substantially linear phase shift of a fundamental of the interpolated, modulated phase information signal 128.

Moreover, the phase interpolator 121 can be configured to control or regulate, in response to a change of the modulation information 129, the first number γ of the capacitors 122_1 to 122_γ which are switched between the first input 124_1 and the output 126, the second number η of the capacitors 122_ γ+1 to 122_β which are switched between the second input 124_2 and the output 126 and the third number $\epsilon$ of the capacitors 122_β+1 to 122_κ which are connected to the reference input 124_3, such that despite of the change of the modulation information 129 an amplitude of a fundamental of the interpolated, modulated phase information signal 128 is maintained substantially constant.

The phase shifted clock signal clk_90 can be a phase-shifted version of the clock signal clk_0 and the phase shift may be in the range of 5° to 179°, e.g., 5°, 10°, 20°, 30°, 40°, 50° 60°, 70°, 80°, 90°, 100°, 110°, 120°, 130°, 140°, 150°, 160°, 170°, 179° phase-shifted version of the clock signal clk.

The modulation information 129 may indicate a desired phase or phase shift of the fundamental of the interpolated, modulated phase information signal 128 (the fundamental of the interpolated, modulated phase information signal 128 may be obtained by low-pass filtering the interpolated, modulated phase information signal 128). Further, the modulation information 129 may indicate at least two numbers out of the first number γ of capacitors to be switched between the first input 124_1 and the output 126, the second number η of capacitors to be switched between the second input 124_2 and the output 126, and the third number $\epsilon$ of capacitors to be switched between the reference input 124_3 and the output 126, in order to achieve the desired phase or phase shift of the fundamental of the interpolated, modulated phase information signal 128.

In the following, differences between the phase interpolator 120 of the digital-to-time converter 130 shown in FIG. 2 and the phase interpolator 121 shown in FIG. 4 are described in detail.

Thereby, it assumed that both phase interpolators (i.e., the phase interpolator 120 shown in FIG. 2 and the phase interpolator 121 shown in FIG. 4) receive the same modulation information 129, such as the modulation code α. In that case, the phase interpolator 121 shown in FIG. 4 may be configured to convert, transform or pre-distort the modulation code α into at least two out of the first number γ of capacitors to be switched between the first input 124_1 and the output 126, the second number η of capacitors to be switched between the second input 124_2 and the output 126, and the third number $\epsilon$ of capacitors to be switched between the reference input 124_3 and the output 126. Observe that the first number γ of capacitors, the second number η of capacitors and the third number $\epsilon$ of capacitors may be digitally coded (e.g., each may range from 1 to $2^n$), and thus be referred to as γ code, η code and $\epsilon$ code.

Moreover, as will become clear from the discussion below, two main sources for non-linearity in the digital-to-time converter shown in FIG. 2 which is based on phase interpolation have been identified.

Figure 5:
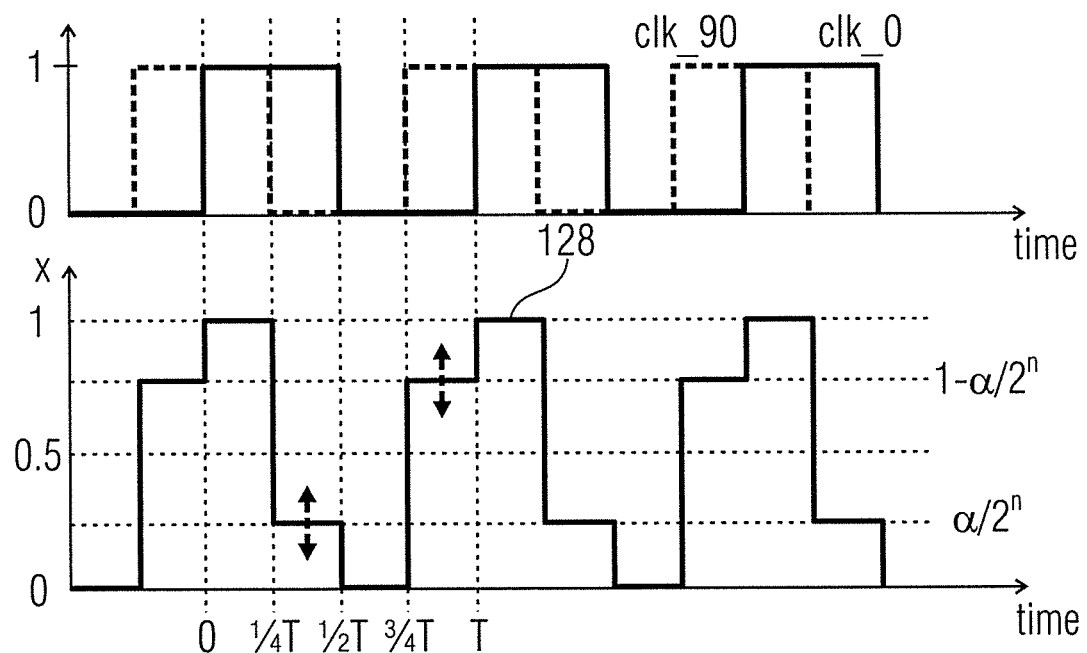
FIG. 5 shows a diagram of the clock signal and the phase shifted clock signal plotted over time, and a diagram of the interpolated, modulated phase information signal provided by the phase interpolator (at the node x without the LC filter) shown in FIG. 2 plotted over time.

FIG. 5 shows a diagram of the clock signal clk_0 and the phase shifted clock signal clk_90 plotted over time, and a diagram of the interpolated, modulated phase information signal 128 provided by the phase interpolator 120 at the node x shown in FIG. 2 plotted over time and assuming that the LC filter is not present. In FIG. 5, the ordinates denote the normalized amplitudes of the respective signals, wherein the abscissas denote the time.

As shown in FIG. 5, between ¼ T and ½ T the normalized amplitude of the clock signal clk_0 is one and the normalized amplitude of the phase shifted clock signal clk_90 is zero (i.e., only the first number α of capacitors 122_1 to 122_α that are connected to the first input 124_1 receive a clock signal having a normalized amplitude equal to one), resulting in that the normalized amplitude of the interpolated, modulated phase information signal 128 amounts to $\alpha/2^n$.

Between ½ T and ¾ T the normalized amplitude of the clock signal clk_0 is zero and the normalized amplitude of the phase shifted clock signal clk_90 is zero. Thus, the sum of the normalized amplitudes is also zero.

Between ¾ T and T the normalized amplitude of the clock signal clk_0 is zero and the normalized amplitude of the phase shifted clock signal clk_90 is one (i.e., only the second number δ of capacitors 122_α+1 to 122_κ that are connected to the second input 124_2 receive a clock signal having a normalized amplitude equal to one), resulting in that the normalized amplitude of the interpolated, modulated phase information signal 128 amounts to $1-\alpha/2^n$.

Observe that between 0 T and ¼ T both, the normalized amplitude of the clock signal clk_0 and the normalized amplitude of the phase shifted clock signal clk_90 amount to one (i.e., all capacitors 122_1 to 122_κ receive clock signals having a normalized amplitude equal to one), resulting in that the normalized amplitude of the interpolated, modulated phase information signal 128 amounts to one which is its maximum value.

In other words, referring to the digital-to-time converter 130 sketched in FIG. 2, assuming that the low-pass filter 134 (e.g., LC filter) is disconnected from the output 126 (node x) of the phase interpolator 120, the resulting waveform at the output 126 (node x) is a staircase waveform as depicted in FIG. 5 (normalized to the supply voltage Vdd of the phase interpolator 120 assuming no losses), dependent on the input code α (for the sake of simplicity a 0.5 Vdd DC bias point at node x is assumed).

In the phase interpolator 120 shown in FIG. 2, α capacitors are connected to the clock signal clk_0 and the remaining $2^n-\alpha$ capacitors are connected to the phase shifted clock signal clk_90, implying that the sum of the in-phase $a_1$ and quadrature $b_1$ components is constant ($a_1+b_1$=constant).

The normalized in-phase $a_1$ and quadrature $b_1$ components of the fundamental tone (the fundamental tone can be achieved by filtering the signal 128 (interpolated, modulated phase information signal) at the output 126 (node x) of the phase interpolator 120 in FIG. 2 with a low-pass filter 134 (e.g., LC filter)) can be calculated as follows:

$$a_1 = \frac{1}{\pi}\int_0^{2\pi} x(\varphi)\cdot\cos(\varphi)\cdot d\varphi = \frac{2}{\pi}\cdot\left(1-\frac{\alpha}{2^n}\right)$$

$$b_1 = \frac{1}{\pi}\int_0^{2\pi} x(\varphi)\cdot\sin(\varphi)\cdot d\varphi = \frac{2}{\pi}\cdot\left(\frac{\alpha}{2^n}\right)$$

Figure 6A:
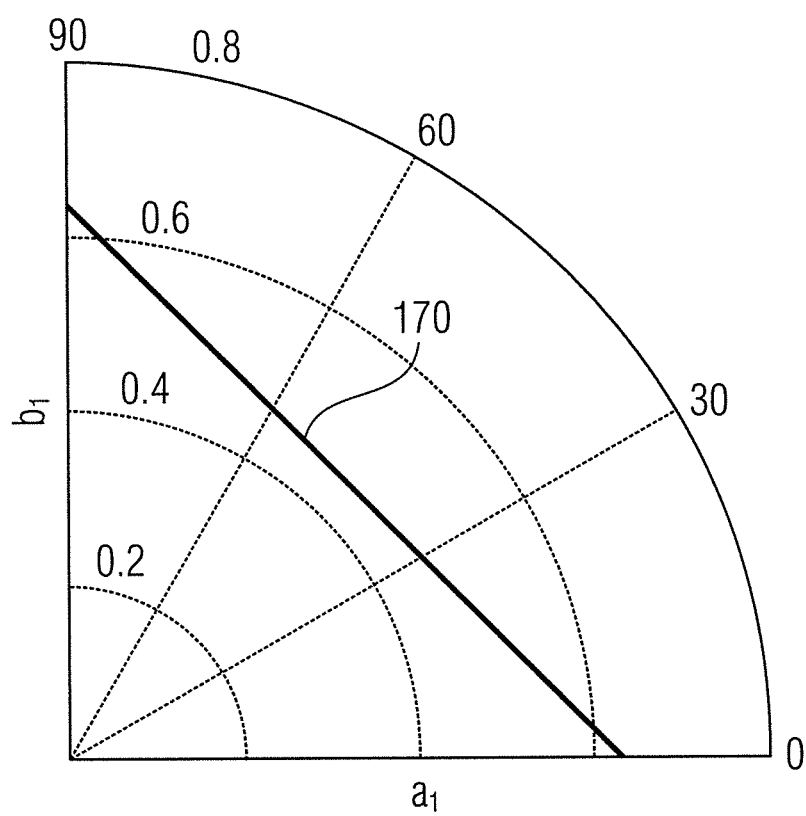
FIG. 6A shows a polar diagram of the points in the complex plane achievable by the digital-to-time converter shown in FIG. 2 assuming orthogonal clocks.

FIG. 6A shows a polar diagram of the points (curve 170) in the complex plane achievable by the digital-to-time converter 130 shown in FIG. 2. Thereby, the ordinate denotes the quadrature $b_1$ component of the fundamental of the interpolated, modulated phase information signal 128, wherein the abscissa denotes the in-phase $a_1$ component of the fundamental of the interpolated, modulated phase information signal 128.

As shown in FIG. 6A, the locus of the complex points 170 achievable by the digital-to-time converter 130 shown in FIG. 2 is therefore a straight line in the complex plane.

In turn, the normalized amplitude A and phase shift φ of the fundamental tone (fundamental of the interpolated, modulated phase information signal 128) result:

$$A = \sqrt{a_1^2+b_1^2} = \frac{2}{\pi}\cdot\sqrt{2\left(\frac{\alpha}{2^n}\right)^2 - 2\left(\frac{\alpha}{2^n}\right)+1}$$

$$\varphi = \arctg\left(\frac{b_1}{a_1}\right) = \arctg\left(\frac{\alpha/2^n}{1-\alpha/2^n}\right)$$

FIG. 6B shows a diagram of the phase shift (curve 172) in degree of the fundamental of the interpolated, modulated phase information signal 128 plotted over the normalized modulation code α, and a diagram of the normalized amplitude (curve 174) of the fundamental of the interpolated, modulated phase information signal 128 plotted over the normalized modulation code α. In other words, FIG. 6B shows phase-shift and normalized amplitude of the fundamental tone vs. code. Normalized modulation code α (or α code) is $\alpha/2^n$.

FIG. 6C shows a diagram of the intrinsic integral non-linearity in degrees (curve 176) of the phase shift of the fundamental of the interpolated, modulated phase information signal 128 plotted over the normalized modulation code α, and a diagram of the integral non-linearity in ps (curve 178) of the amplitude of the fundamental of the interpolated, modulated phase information signal 128 plotted over the normalized modulation code α. In other words, FIG. 6C shows integral non-linearity of the digital-to-time converter 130 in phase and time (assuming orthogonal 4 GHz input clock) vs. code (Matlab models). Normalized modulation code α (or α code) is $\alpha/2^n$.

As shown in FIG. 6B, the phase shift is not linear with the input code α, introducing a non-linearity inherent to the digital-to-time converter 130 implementation (FIG. 6C). It can be noticed how the calculated non-linearity reproduces qualitatively and quantitatively the simulated non-linearity for node y, i.e., after the low-pass filter (e.g., LC filter) 134, reported in FIG. 2.

On top of this, the amplitude of the sine wave at the output 146 of the low-pass filter 134 (or node y) is not constant vs. the input digital code α (FIG. 6B). This implies that the signal driving the output buffer 142 presents a code-dependent slew rate at the trip point, causing additional non-linearity generated by the output buffer 142 (see FIG. 2).

The two intrinsic sources of non-linearity can be eliminated by proper digital pre-distortion of the input code. Therefore, the aim is to achieve 1) a linear phase-shift vs. input code α and 2) a constant amplitude of the sine wave at the output 146 (node y) of the low-pass filter 134 driving the output buffer 142.

A sine wave with constant amplitude at the output 146 (node y) of the low-pass filter 134 corresponds to a circular trajectory on the polar plot. From FIG. 6A, it is evident that the maximum amplitude $A_{cir}$ for a circular trajectory achievable by the considered digital-to-time converter 130 is $1/\sqrt{2}$ of the maximum amplitude $A_{max}$, i.e., the amplitude at 45° phase-shift:

$$A_{cir} = \frac{1}{\sqrt{2}}\cdot A_{max} = \frac{1}{\sqrt{2}}\cdot\frac{2}{\pi} = A(\pi/4)$$

Smaller amplitudes can be achieved as well, but it is important to maximize the amplitude of the sine wave in order to drive the output buffer 142 with steep rising and falling edges, minimizing the power consumption of the buffer 142 and improving noise performance.

By setting the constraints of 1) linear phase shift and 2) constant amplitude, the dependence of the in-phase $a_1$ component and quadrature $b_1$ component on the input code $\alpha$ can be calculated:

$$\begin{cases} \varphi = \arctan\left(\frac{b_1}{a_1}\right) = \frac{\pi}{2} \cdot \left(\frac{\alpha}{2^n}\right) \\ A_{cir} = \frac{1}{\sqrt{2}} \cdot \frac{2}{\pi} = \sqrt{a_1^2 + b_1^2} \end{cases} \Rightarrow$$

$$\begin{cases} a_1 = \frac{1}{\sqrt{2}} \cdot \frac{2}{\pi} \cdot \frac{1}{\sqrt{\tan^2\left(\frac{\pi}{2} \cdot \frac{\alpha}{2^n}\right) + 1}} = \frac{1}{\sqrt{2}} \cdot \frac{2}{\pi} \cdot \cos\left(\frac{\pi}{2} \cdot \frac{\alpha}{2^n}\right) \\ b_1 = \frac{1}{\sqrt{2}} \cdot \frac{2}{\pi} \cdot \frac{\tan\left(\frac{\pi}{2} \cdot \frac{\alpha}{2^n}\right)}{\sqrt{\tan^2\left(\frac{\pi}{2} \cdot \frac{\alpha}{2^n}\right) + 1}} = \frac{1}{\sqrt{2}} \cdot \frac{2}{\pi} \cdot \cos\left(\frac{\pi}{2} \cdot \frac{\alpha}{2^n}\right) \end{cases}$$

As expected, in order to achieve 1) a linear phase shift and 2) a constant amplitude of the sine wave at the output 146 (node y) of the low-pass filter 134, the in-phase $a_1$ and quadrature $b_1$ components (of the fundamental of the interpolated, phase information signal 128) have to exhibit a cosine and sine dependence on the input code $\alpha$ respectively.

As a consequence, the sum of the in-phase a1 and quadrature b1 components (of the fundamental of the interpolated, phase information signal 128) is not any longer constant. This means that in turn part of the digital-to-time converter cells (or capacitor cells, or capacitors) need to be connected neither to the clock signal clk_0 nor to the phase shifted clock signal clk_90 but simply be switched off. For these cells (capacitor cells), the capacitors can be connected to ac-ground, i.e. either to a positive supply voltage Vdd or ground. In order to achieve a symmetric waveform around the DC bias point set at the output 126 (node x) of the phase interpolator 120, half of the capacitor cells that are switched off can be connected to the positive supply voltage Vdd, wherein the other half of the capacitor cells that are switched off can be connected to ground.

Figure 7:
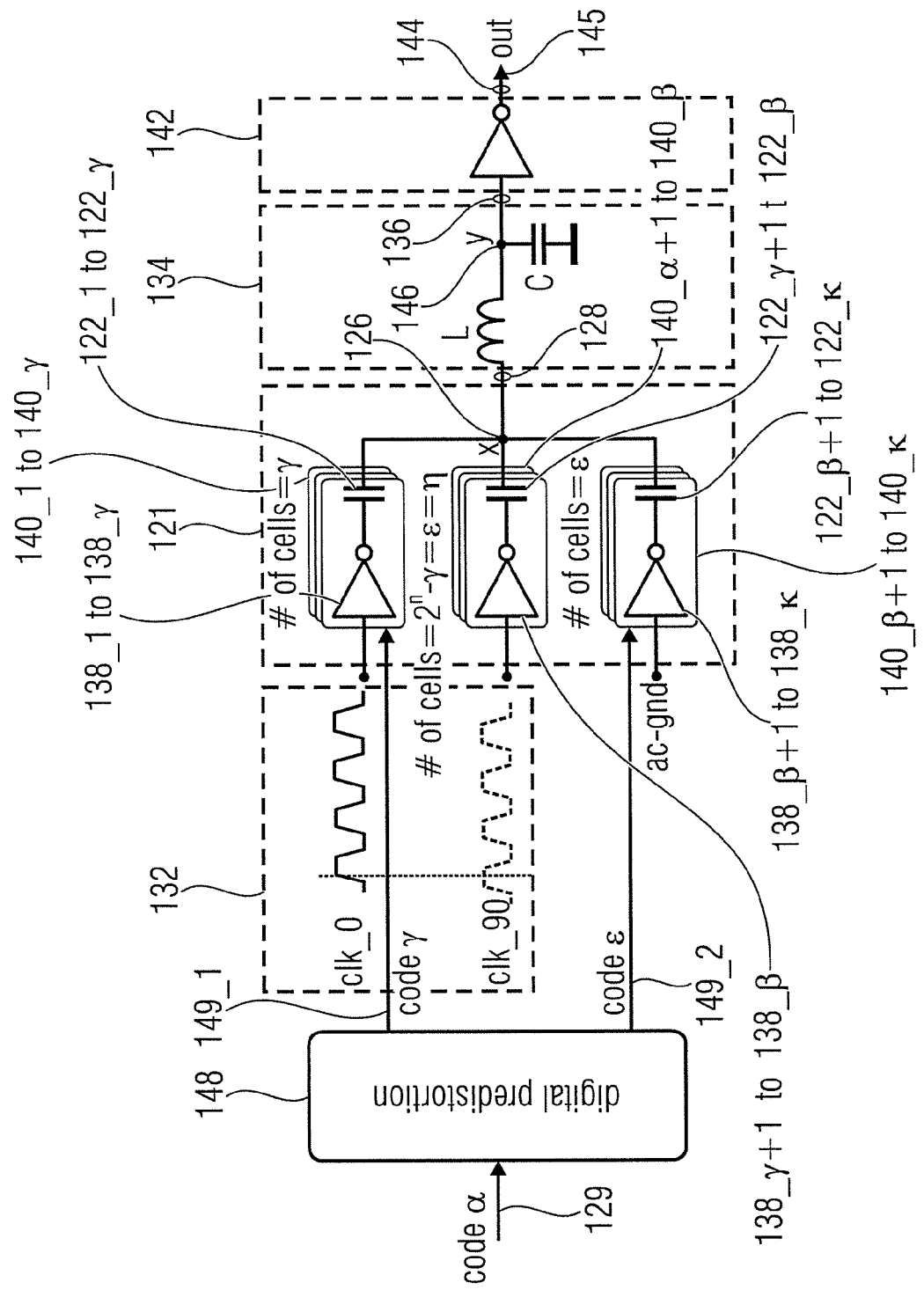
FIG. 7 shows a block diagram of a digital-to-time converter comprising a clock signal provider, a low-pass filter, an analog-to-digital converter and the phase interpolator shown in FIG. 4.

FIG. 7 shows a block diagram of a digital-to-time converter 130 comprising a clock signal provider 132, a low-pass filter 134, an analog-to-digital converter 142 and the phase interpolator 121 shown in FIG. 4. As already mentioned, the phase interpolator is configured to switch dependent on the modulation information 129, a first number $\gamma$ of the capacitors 122_1 to 122_γ between the first input 124_1 and the output 126, a second number $\eta$ of the capacitors 122_γ+1 to 122_β between the second input 124_2 and the output, and a third number $\epsilon$ of the capacitors 122_β+1 to 122_κ to the reference input 124_3.

Further, the digital-to-time converter 130 can comprise a pre-distortion unit 148 configured to receive the modulation information 129 and to provide control signals 149_1 and 149_2 controlling the phase interpolator 121 to switch the first number $\gamma$ of the capacitors 122_1 to 122_γ between the first input 124_1 and the output 126, the second number $\eta$ of the capacitors 122_γ+1 to 122_β between the second input 124_2 and the output 126, and the third number E of the capacitors 122_β+1 to 122_κ to the reference input 124_3.

A first control signal 149_1 of the control signals 149_1 and 149_2 may indicate the first number $\gamma$ of capacitors, wherein a second control signal 149_2 of the control signals 149_1 and 149_2 may indicate the third number $\epsilon$ of capacitors.

Further, the pre-distortion unit 148 can be configured to control the phase interpolator 121 to vary, in response to a change of the modulation information 129, the first number $\gamma$ of the capacitors 122_1 to 122_γ which are switched between the first input 124_1 and the output 126, the second number $\eta$ of the capacitors 122_γ+1 to 122_β which are switched between the second input 124_1 and the output 126 and the third number $\epsilon$ of the capacitors 122_β+1 to 122_κ which are connected to the reference input 124_3, such that the change of the modulation information 129 leads to a substantially linear phase shift of the modulated phase signal 136.

Moreover, the pre-distortion unit 148 can be configured to control the phase interpolator 121 to vary, in response to a change of the modulation information 129, the first number $\gamma$ of the capacitors 122_1 to 122_γ which are switched between the first input 124_1 and the output 126, the second number $\eta$ of the capacitors 122_γ+1 to 122_β which are switched between the second input 124_1 and the output 126 and the third number $\epsilon$ of the capacitors 122_β+1 to 122_κ which are connected to the reference input 124_3, such that despite of the change of the modulation information 129 an amplitude of the modulated phase signal 136 is maintained substantially constant.

The digital-to-time converter 130 can further comprise an analog-to-digital converter 142 configured to convert the modulated phase signal 136 into a modulated clock signal 144. As indicated in FIG. 7, the analog-to-digital converter 142 can be implemented by one or more cascaded inverters.

As shown in FIG. 7, the phase interpolator 121 can comprise a plurality of capacitor cells 140_1 to 140_κ, wherein each capacitor cell of the plurality of capacitor cells 140_1 to 140_κ comprises one capacitor of the plurality of capacitors 122_1 to 122_κ, wherein each capacitor cell is controlled (e.g., by the control signals 149_1 and 149_2) to connect, dependent on the modulation information, its capacitor either to the first input 124_1, to the second input 124_2 or to the reference input 124_3.

In other words, the proposed arrangement of a linear digital-to-time converter 130 based on the phase interpolator 121 (see FIG. 7) is made by the following key building blocks: 1) a digital-to-time converter cell (or capacitor cell) that if switched on, is either connected to the first input 124_1 at which the clock signal clk_0 is present or to the second input 124_2 at which the phase shifted clock signal clk_90 is present, otherwise the cell (or capacitor cell) is switched off, i.e., the capacitor is switched to the reference input 124_3 at which the reference signal, for example, ac-ground (e.g., a positive supply voltage Vdd or a ground potential) is present, and 2) pre-distortion logic 148 that converts the input n bits digital code $\alpha$ (modulation code $\alpha$) into a digital code $\gamma$ providing the amount of cells connected to the clock signal clk_0 and a digital code $\epsilon$ providing the amount of cells that are switched off.

In this way, for code $\alpha$ there are $\gamma$ cells (capacitor cells 140_1 to 140_γ) that are connected to the first input 124_1 at which the clock signal clk_0 is present, $\epsilon$ cells (capacitors cells 140_β+1 to 140_κ) that are switched off (e.g., connected to the reference input 124_3), and $\eta=2^n-\gamma-\epsilon$ cells (capacitor cells 140_γ+1 to 140_β) that are connected to the second input 124_2 at which the phase shifted clock signal clk_90 is present.

Figure 8:
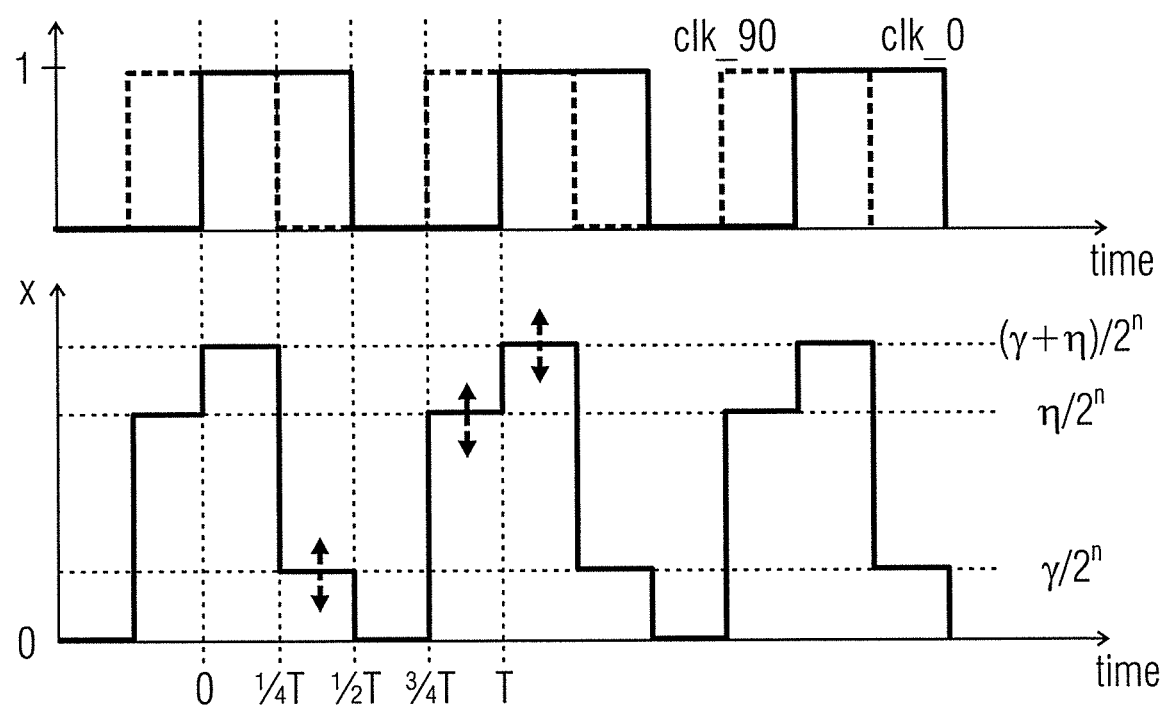
FIG. 8 shows a diagram of the clock signal and the phase shifted clock signal plotted over time, and a diagram of the interpolated, modulated phase information signal provided by the phase interpolator (at the node x without the LC filter) shown in FIGS. 4 and 7 plotted over time.

FIG. 8 shows a diagram of the clock signal clk_0 and the phase shifted clock signal clk_90 plotted over time, and a diagram of the interpolated, modulated phase information signal 128 provided by the phase interpolator 121 at the node x shown in FIGS. 4 and 7 plotted over time and assuming that the LC filter is not present. In FIG. 8, the ordinates denote the normalized amplitudes of the respective signals, wherein the abscissas denote the time. In other words, FIG. 8 shows a diagram of the input clocks clk_0 and clk_90 and a diagram of the waveform at node x for the digital-to-time converter 130 shown in FIG. 7 if the low-pass filter 134 (e.g., LC filter) is disconnected.

As shown in FIG. 8, while the normalized amplitude of the clock signal clk_0 is one and the normalized amplitude of the phase shifted clock signal clk_90 is zero (e.g., between ¼ T and ½ T), the normalized amplitude of the interpolated, modulated phase information signal 128 is $\gamma/2^n$, since only the first number $\gamma$ of capacitors 122_1 to 122_$\gamma$ that are connected to the first input 124_1 receive a clock signal having a normalized amplitude equal to one.

Between ½ T and ¾ T the normalized amplitude of the clock signal clk_0 is zero and the normalized amplitude of the phase shifted clock signal clk_90 is zero. Thus, the sum of the normalized amplitudes is also zero.

While the normalized amplitude of the clock signal clk_0 is zero and the normalized amplitude of the phase shifted clock signal clk_90 is one (e.g., between ¾ T and T), the normalized amplitude of the interpolated, modulated phase information signal 128 amounts to $\eta/2^n$, since only the second number $\eta$ of capacitors 122_$\gamma$+1 to 122_$\beta$ that are connected to the second input 124_2 receive a clock signal having a normalized amplitude equal to one.

Observe that while the normalized amplitude of the clock signal clk_0 and the normalized amplitude of the phase shifted clock signal clk_90 amount to one (e.g., between 0 T and ¼ T), the normalized amplitude of the interpolated, modulated phase information signal 128 amounts to $(\gamma+\eta)/2^n$, since only the first number $\gamma$ of capacitors 122_1 to 122_$\gamma$ that are connected to the first input 124_1 and the second number $\eta$ of capacitors 122_$\gamma$+1 to 122_$\beta$ that are connected to the second input 124_2 receive clock signals having a normalized amplitude equal to one.

Thus, in contrast to the phase interpolator 120 shown in FIG. 2, the phase interpolator 121 shown in FIGS. 4 and 7 is also capable of adjusting the amplitude of the interpolated, modulated phase information signal 128 in the periods during which the normalized amplitude of the clock signal clk_0 and the normalized amplitude of the phase shifted clock signal clk_90 is one (e.g., between 0 T and ¼ T). The steps can be adjusted independently in case one clock is one and the other clock is zero because of $\gamma$, $\eta$ and $\epsilon$.

In other words, the proposed digital-to-time converter 130 provides a staircase waveform at the output 126 (or node x without LC filter) of the phase interpolator 121 as depicted in FIG. 8 (normalized to the positive supply voltage Vdd of the phase interpolator 121). It is evident that, in contrast to the digital-to-time converter 130 shown in FIG. 2, also the maximum value of the staircase can be modulated by the input digital code (modulation code $\alpha$).

The normalized in-phase $a_1$ and quadrature $b_1$ components of the fundamental tone for the proposed digital-to-time converter 130 in FIG. 7 arrangement can be calculated as follows:

$$a_1 = \frac{1}{\pi}\int_0^{2\pi} x(\varphi)\cdot\cos(\varphi)\cdot d\varphi = \frac{2}{\pi}\cdot\left(\frac{\gamma}{2^n}\right)$$

$$b_1 = \frac{1}{\pi}\int_0^{2\pi} x(\varphi)\cdot\sin(\varphi)\cdot d\varphi = \frac{2}{\pi}\cdot\left(\frac{\eta}{2^n}\right)$$

By imposing:

$$a_1 = \frac{2}{\pi}\cdot\left(\frac{\gamma}{2^n}\right) = \frac{1}{\sqrt{2}}\cdot\frac{2}{\pi}\cdot\cos\left(\frac{\pi}{2}\cdot\frac{\alpha}{2^n}\right)$$

-continued $$b_1 = \frac{2}{\pi}\cdot\left(\frac{\eta}{2^n}\right) = \frac{1}{\sqrt{2}}\cdot\frac{2}{\pi}\cdot\sin\left(\frac{\pi}{2}\cdot\frac{\alpha}{2^n}\right)$$

The digital pre-distortion is readily defined:

$$\gamma = 2^n\cdot\frac{1}{\sqrt{2}}\cdot\cos\left(\frac{\pi}{2}\cdot\frac{\alpha}{2^n}\right)$$

$$\eta = 2^n\cdot\frac{1}{\sqrt{2}}\cdot\sin\left(\frac{\pi}{2}\cdot\frac{\alpha}{2^n}\right)$$

$$\varepsilon = 2^n - \gamma - \eta$$

Figure 9A:
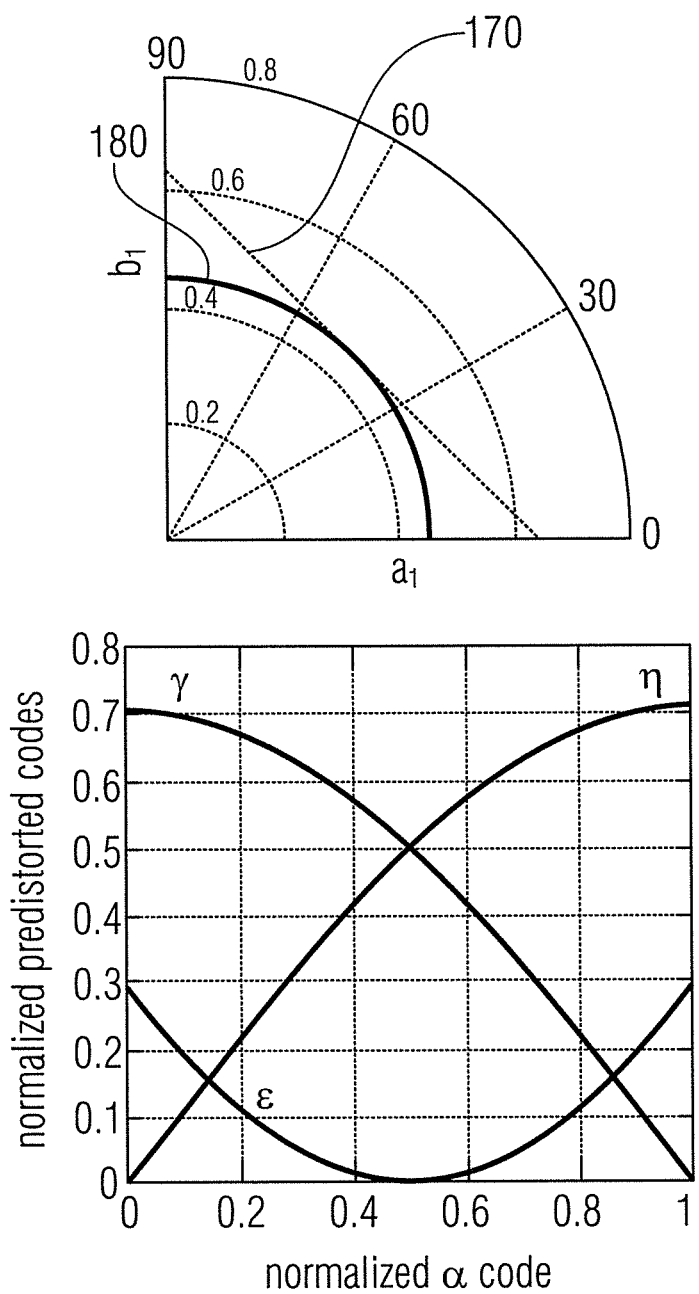
FIG. 9A shows a polar diagram of the points in the complex plane achievable by the digital-to-time converter shown in FIG. 7, and a diagram of the first number of capacitors, the second number of capacitors and the third number of capacitors plotted over the normalized modulation code assuming orthogonal clocks.

FIG. 9A shows a polar diagram of the points 180 (solid line) in the complex plane achievable by the digital-to-time converter 130 shown in FIG. 7. Thereby, the ordinate denotes the quadrature $b_1$ component of the fundamental of the interpolated, modulated phase information signal 128, wherein the abscissa denotes the in-phase $a_1$ component of the fundamental of the interpolated, modulated phase information signal 128.

As shown in FIG. 9A, the locus of the complex points achievable by the digital-to-time converter 130 shown in FIG. 7 is therefore a circular line in the complex plane.

Further, FIG. 9A shows a diagram of the first number $\gamma$ of capacitors, the second number $\eta$ of capacitors and the third number $\epsilon$ of capacitors plotted over the normalized $\alpha$ code. Normalized a code is $\alpha/2^n$.

Note that in FIG. 9A, for comparison, a curve 170 (dashed line) indicates complex points achievable by the digital-to-time converter 130 shown in FIG. 2.

FIG. 9B shows a diagram of the phase shift 182 (solid line) in degree of the fundamental of the interpolated, modulated phase information signal 128 provided by the phase interpolator shown in FIG. 7 plotted over the normalized $\alpha$ code, and a diagram of the normalized amplitude 184 (solid line) of the fundamental of the interpolated, modulated phase information signal 128 provided by the phase interpolator 121 shown in FIG. 7 plotted over the normalized $\alpha$ code. In other words, FIG. 9B shows phase-shift and normalized amplitude of the fundamental tone vs. code. Normalized a code is $\alpha/2^n$.

For comparison, in FIG. 9B a curve 172 (dashed line) indicates the phase shift in degree of the fundamental of the interpolated, modulated phase information signal 128 provided by the phase interpolator shown in FIG. 2, wherein a curve 174 (dashed line) indicates the normalized amplitude of the fundamental of the interpolated, modulated phase information signal 128 provided by the phase interpolator 120 shown in FIG. 2.

FIG. 9C shows a diagram of the intrinsic integral non-linearity 186 (solid line) in degrees of the phase shift of the fundamental of the interpolated, modulated phase information signal 128 provided by the phase interpolator 121 shown in FIG. 7 plotted over the normalized $\alpha$ code. In other words, FIG. 9C shows integral non-linearity of the digital-to-time converter 130 shown in FIG. 7 in phase vs. code (Matlab models). Normalized a code is $\alpha/2^n$.

Also in FIG. 9C, for comparison, a curve 176 (dashed line) indicates the integral non-linearity in ps of the phase shift of the fundamental of the interpolated, modulated phase information signal 128 provided by the phase interpolator 120 shown in FIG. 2.

To summarize, the lower plot of FIG. 9A shows the pre-distorted digital codes vs. the input code $\alpha$. The resulting locus of the complex points achievable by the digital-to-time converter arrangement shown in FIG. 7 is shown in the upper plot of FIG. 9B: as expected it is a circular trajectory in the 0°-90° quadrant. The normalized amplitude A of the fundamental tone is constant and the phase shift φ is linear vs. the input code α (FIG. 9B). As a consequence, the integral non-linearity of the digital-to-time converter 130 at node y is eliminated. The constant amplitude of the sine wave at node y in turn minimizes the distortion introduced by the output buffer 142.

Observe that the digital pre-distortion presented above can be applied to any kind of digital-to-time converter based on weighted interpolation of two orthogonal phases.

Figure 10B:
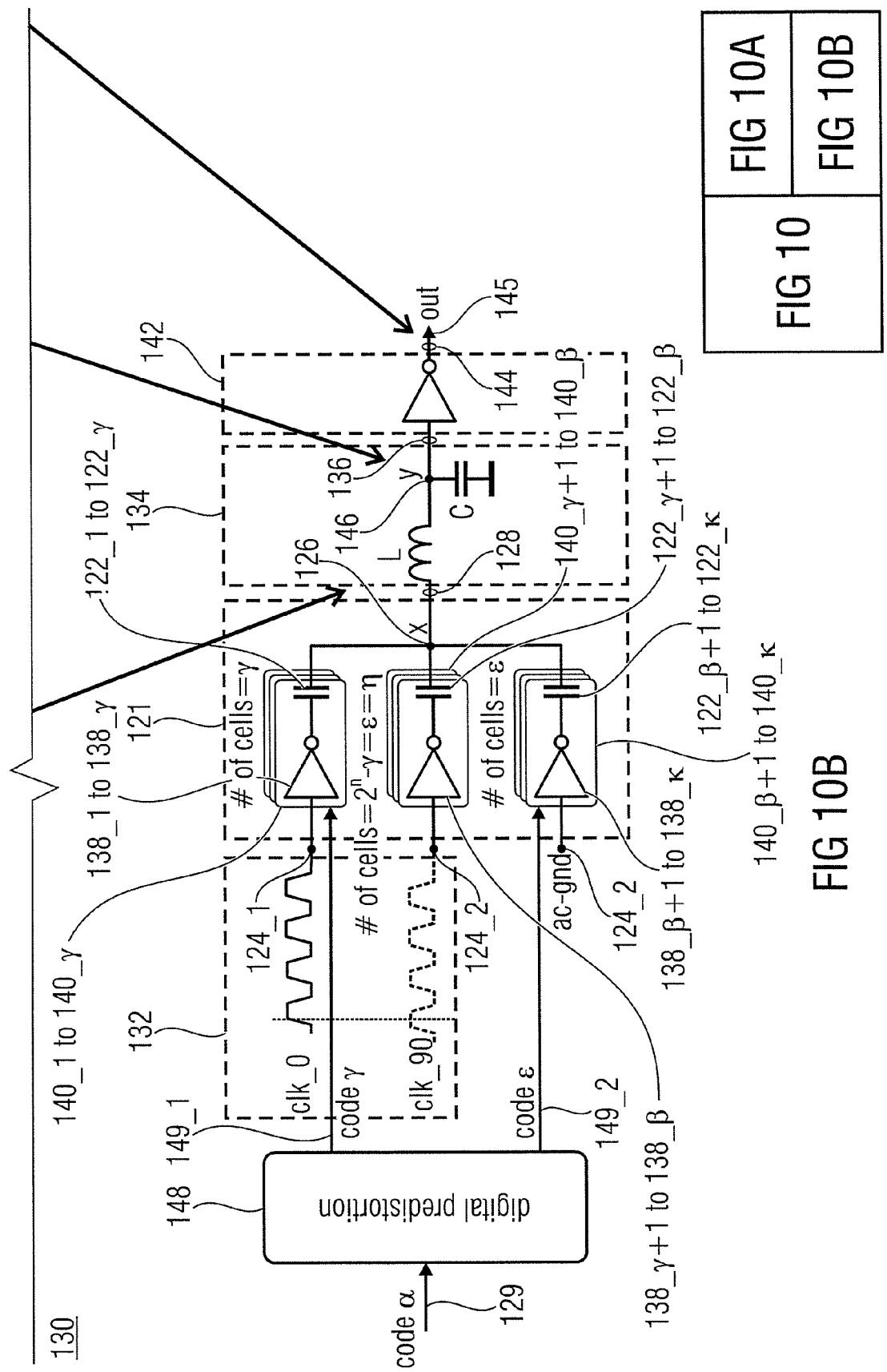
FIG. 10 (including 10A and 10B) shows a block diagram of the digital-to-time converter shown in FIG. 7 and diagrams of signals present at different nodes of the digital-to-time converter.

FIG. 10 shows a block diagram of the digital-to-time converter 130 and diagrams of signals present at different nodes of the digital-to-time converter 130.

A first diagram 150 shows a waveform of the interpolated, modulated phase information signal 128 provided at the output 126 of the phase interpolator 121. Thereby, the ordinate denotes the amplitude in volts, where the abscissa denotes the time in ns.

A second diagram 152 shows a waveform of the modulated phase signal 136 provided by the low-pass filter 134 at its output 146 (node filt). Thereby, the ordinate denotes the amplitude in volts, where the abscissa denotes the time in ns.

A third diagram 154 shows a waveform of the modulated clock signal 144 provided by the analog-to-digital converter 142. Thereby, the ordinate denotes the amplitude in volts, where the abscissa denotes the time in ns.

In other words, FIG. 10 shows a digital-to-time converter 130 concept, where part of the unit cells (capacitor cells 140_1 to 140_κ) can also be switched off. It can be noticed that the generated sine wave at the output 126 (node y) of the phase interpolator 121 exhibits a constant amplitude, eliminating the code dependent distortion introduced by the output buffer 142.

Figure 11:
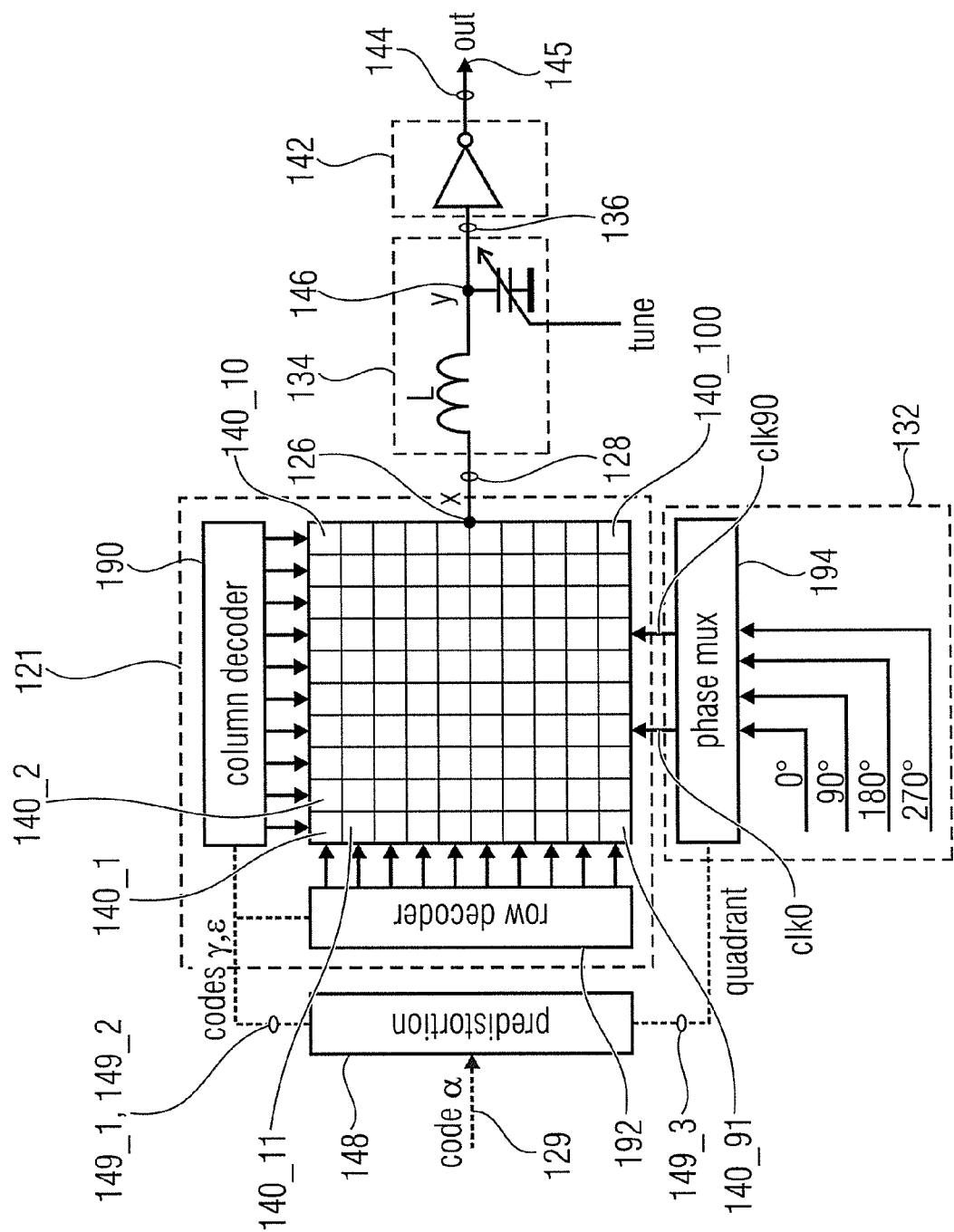
FIG. 11 shows a block diagram of an implementation of the digital-to-time converter shown in FIGS. 7 and 10 arranged in an array.

FIG. 11 shows a block diagram of a digital-to-time converter 130. The phase interpolator 121 of the digital-to-time converter 130 can comprise an array of capacitor cells 140_1 to 140_κ arranged in lines and columns. Each capacitor cell of the array of capacitor cells 140_1 to 140_κ comprises one capacitor of the plurality of capacitors 122_1 to 122_κ, wherein each capacitor cell of the plurality of capacitor cells 140_1 to 140_κ is controlled to connect its capacitor, dependent on the modulation information 119, either to the first input 124_1, to the second input 124_2 or to the reference input 124_3.

Further, each capacitor cell of the array of capacitor cells 140_1 to 140_κ can comprise a multiplexer configured to connect the capacitor 122_1 to 122_κ of the respective capacitor cell 140_1 to 140_κ, dependent on the modulation information 129, either to the first input 124_1 of the phase interpolator 121, to the second input 124_2 of the phase interpolator 121 or to the reference input 124_3 of the phase interpolator 121.

For example, the first capacitor cell 140_1 of the plurality of capacitor cells 140_1 to 140_κ can comprise a first multiplexer and a first capacitor 122_1. The first multiplexer can be configured to connect, dependent on the modulation information 129, the first capacitor 122_1, either to the first input 124_1 of the phase interpolator 121, to the second input 124_2 of the phase interpolator 121 or to the reference input 124_3 of the phase interpolator 121.

Similarly, the second capacitor cell 140_2 of the plurality of capacitor cells 140_1 to 140_κ can comprise a second multiplexer and a second capacitor 122_2. The second multiplexer can be configured to connect, dependent on the modulation information 129, the second capacitor 122_2, either to the first input 124_1 of the phase interpolator 121, to the second input 124_2 of the phase interpolator 121 or to the reference input 124_3 of the phase interpolator 121.

Alternatively, each capacitor cell of the array of capacitor cells 140_1 to 140_κ can comprise a multiplexer and a bypass switch. The multiplexer can be configured to connect the capacitor 122_1 to 122_κ of the respective capacitor cell 140_1 to 140_κ, dependent on the modulation information 129, either to the first input 124_1 of the phase interpolator 121 or to the second input 124_2 of the phase interpolator. The bypass switch can be configured to connect, dependent on the modulation information 129, the capacitor 122_1 to 122_κ of the respective capacitor cell 140_1 to 140_κ to the reference input 124_3 of the phase interpolator 121 (thereby bypassing the connection realized by the multiplexer).

Note that in FIG. 11, the phase interpolator 121 in one embodiment comprises an array of capacitor cells 140_1 to 140_κ. The phase interpolator 121 may comprise an array of 2, 4, 8, 16, 32, 64, 128, 256, 512, 1024, 2048, 4096, 8192 or even more capacitor cells 140_1 to 140_κ.

The phase interpolator 121 can be configured to transform the modulation information 129 in a plurality of row control signals and a plurality of column control signals using a thermometer code, and to control the capacitor cells 140_1 to 140_κ with the row control signals and the column control signals.

Further, the phase interpolator 121 can comprise a column decoder 190 configured to provide the plurality of column control signals based on the modulation information 129, and a row decoder 192 configured to provide the plurality of row control signals based on the modulation information 129.

For example, as shown in FIG. 10, the column decoder 190 and the row decoder 192 can be connected to the pre-distortion unit 148. The pre-distortion unit 148 can be configured to receive the modulation information 129 and provide the control signals 149_1 and 149_2 (e.g., codes γ and ε) for controlling the phase interpolator 121 based on the modulation information 129. Thereby, the column decoder 190 of the phase interpolator 121 can be configured to provide the plurality of column control signals based on at least one of the control signals 149_1 and 149_2 provided by the pre-distortion unit 148, wherein the row decoder 192 can be configured to provide the plurality of row control signals based on at least one of the control signals 149_1 and 149_2 provided by the pre-distortion unit 148.

Furthermore, the clock signal provider 132 of the digital-to-time converter 130 can comprise a phase multiplexer 194 controlled to provide, dependent on the modulation information 129, two of at least three clock signals having different phase shifts as the clock signal clk_0 and the phase shifted clock signal clk_90.

The phase multiplexer 194 can be connected to the pre-distortion unit 148, wherein the pre-distortion unit 148 can be configured to control (e.g., via a further control signal 149_3), dependent on the modulation information 129, the phase multiplexer 194 to provide two of the at least three clock signals having different phase shifts as the clock signal clk_0 and the phase shifted clock signal clk_90.

For example, the phase multiplexer 194 may receive a first clock signal having a first phase (e.g., 0°), a second clock signal having a second phase (e.g., 90°, a third clock signal having a third phase (e.g., 180°) and a fourth clock signal having a fourth phase (e.g., 270°). The pre-distortion unit 148 can be configured to control the phase multiplexer 194 to provide two of the four clock signals as the clock signal clk_0 and the phase shifted clock signal clk_90, such as the first clock signal and the second clock signal, the second clock signal and the third clock signal, the third clock signal and the fourth clock signal, or the fourth clock signal and the first clock signal.

In other words, the phase interpolator 121 can be a capacitor array 140_1 to 140_κ with a multiplexer. It can be arranged in a matrix manner as shown in FIG. 11. The digital-to-time converter 130 with phase multiplexer 194 enables phase rotation and 360° phase delay. Given an input code α of n+2 bits, the 2 most significant bits (MSB) may define the quadrant and may be fed to the phase multiplexer 194 in order to select the appropriate two orthogonal phases. The remaining n bits can be pre-distorted to generate γ and ε codes.

For different frequency channels the frequency of the input clocks can be changed accordingly, and in turn the low-pass filter 134 (e.g., LC filter) can be tuned (appropriately tuned) for optimal performance of the digital-to-time converter 130.

Figure 12A:
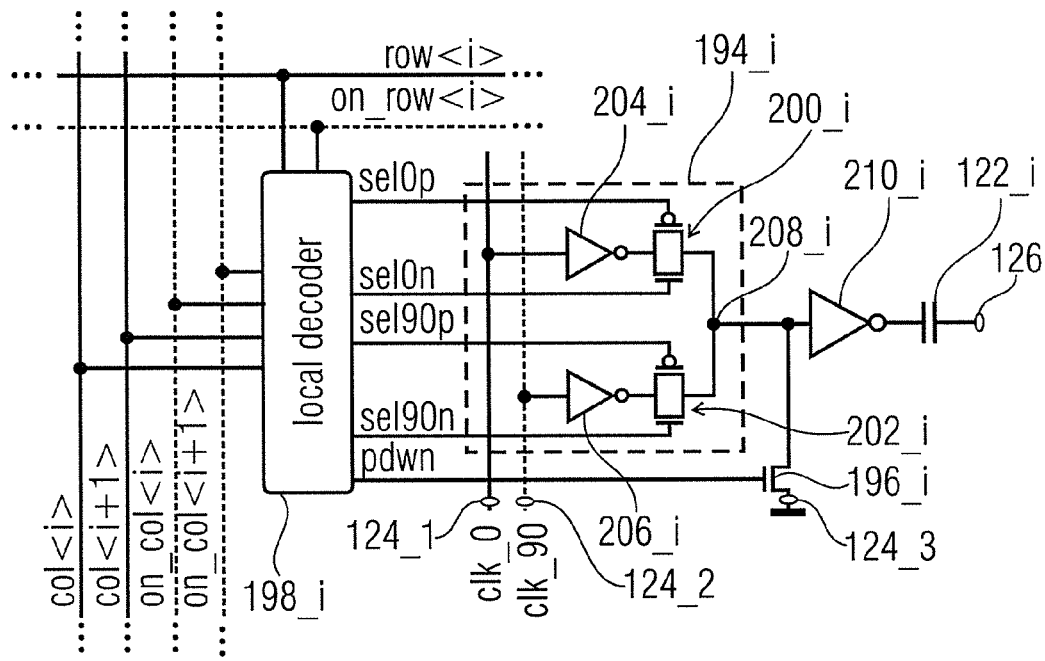
FIG. 12A shows a block diagram of an implementation of one capacitor cell of the array of capacitor cells shown in FIG. 11.

FIG. 12A shows a possible implementation of one capacitor cell 140_i of the array of capacitor cells 140_1 to 140_κ shown in FIG. 11. The capacitor cell 140_i can comprise one capacitor 122_i of the plurality of capacitors 122_1 to 122_κ, a multiplexer 194_i of the plurality of multiplexers 194_i a bypass switch 196_i of a plurality of bypass switches and a local decoder 198_i of a plurality of local decoders 198_i.

As already mentioned, the multiplexer 194_i can be configured to connect, dependent on the modulation information 129, the capacitor 122_i of the respective capacitor cell 140_i either to the first input 124_1 of the phase interpolator 121 or to the second input 124_2 of the phase interpolator 121. The bypass switch 196_i can be configured to connect, dependent on the modulation information 129, the capacitor 122_i of the respective capacitor cell 140_i to the reference input 124_3 of the phase interpolator 121 when none of the inputs to the multiplexer is selected, i.e., when the multiplexer is in its three state.

The local decoder 198_i can be configured to provide at least one control signal for controlling the respective capacitor cell 140_i to connect its capacitor 122_i either to the first input 124_1 of the phase interpolator 121, to the second input 124_2 of the phase interpolator 121 or to the reference input 124_3 of the phase interpolator 121, dependent on a column control signal col<i> of the plurality column control signals and a row control signal row<i> of the plurality of row control signals, corresponding to the respective capacitor cell 122_i. Moreover, the local decoder 198_i can be configured to provide at least one control signal for controlling the respective capacitor cell 140_i further dependent on a further column control signal on_col<i> of a plurality of further column control signals and a further row control signal on_row<i> of a plurality of further row control signals, corresponding to the respective capacitor cell 122_i.

For example, the local decoder 198_i can be configured to provide a first control signal sel0 controlling the capacitor cell 140_i (or more precisely the multiplexer 194_i of the respective capacitor cell 140_i) to connect the capacitor 122_i of the respective capacitor cell 140_i to the first input 124_1 of the phase interpolator 121, a second control signal sel90 controlling the capacitor cell 140_i (or more precisely the multiplexer 194_i of the respective capacitor cell 140_i) to connect the capacitor 122_i of the respective capacitor cell 140_i to the second input 124_2 of the phase interpolator 121, and a third control signal pdwn controlling the capacitor cell 140_i (or more precisely, dependent on the implementation of the capacitor cell 140_i, the multiplexer 194_i or the bypass switch 196_i of the respective capacitor cell 140_i) to connect the capacitor 122_i of the respective capacitor cell 140_i to the reference input 124_3 of the phase interpolator 121.

Note that the first control signal sel0 may be a differential control signal having a first component sel0p and a second component sel0n. Similarly. The second control signal sel90 may be a differential control signal having a first component sel90p and a second component sel90n.

Further, the local decoder 198_i can be configured to receive a column control signal col<i+1> corresponding to a column having a higher order, and to override the respective column control signal col<i> and the respective row control signal row<i> dependent on the column control signal col<i+1> corresponding to the column having the higher order.

In addition, the local decoder 198_i can be configured to receive a further column control signal on_col<i+1> corresponding to a column having a higher order, and to override the respective further column control signal on_col<i> and the respective further row control signal on_row<i> dependent on the further column control signal on_col<i+1> corresponding to the column having the higher order.

Note that the column control signal col<i> and the row control signal row<i> may indicate whether the capacitor 122_i of the respective capacitor cell 140_i is to be switched to the first input 124_1 of the phase interpolator 121 or to the second input 124_2 of the phase interpolator 121, wherein the further column control signal on_col<i> and the further row control signal on_row<i> may indicate whether the capacitor 122_i of the respective capacitor cell 140_i is to be switched to the reference input 124_3 (e.g., be switched on or off).

As shown in FIG. 12A, the multiplexer 194_i can be implemented by a first transmission gate 200_i configured to connect the capacitor 122_i to the first input 124_1 of the phase interpolator 121 in dependence on the first component sel0p and the second component sel0n of the differential first control signal sel0, and by a second transmission gate 202_i configured to connect the capacitor 122_i to the second input 124_2 of the phase interpolator 121 in dependence on the first component sel90p and the second component sel90n of the differential second control signal sel90.

The bypass switch 196_i can be implemented by a transistor (e.g., a NMOS transistor) configured to connect the capacitor 122_i to the third input 124_2 of the phase interpolator 121 in dependence on the third control signal pdwn, which further depends con sel0 and sel90.

Referring to FIG. 12A, the multiplexer 194_i can further comprise a first inverter 204_i and a second inverter 206_i. The first inverter 204_i and the first transmission gate 200_i can be connected in series between the first input 124_1 of the phase interpolator 124_1 and an output 208_i of the multiplexer 194_i, wherein the second inverter 206_i and the second transmission gate 202_i can be connected in series between the second input 124_2 of the phase interpolator 121 and the output 208_i of the multiplexer 194_i.

The bypass switch 196_i can be connected in series between the output 208_i of the multiplexer 194_i and the reference input 124_3 of the phase interpolator.

The capacitor cell 140_i can further comprise an inverter 210_i, wherein the inverter 210_i and the capacitor 122_i can be connected in series between the output 208_i of the multiplexer 194_i ant the output 126 of the phase interpolator 121.

In other words, FIG. 12A shows a digital-to-time converter cell 140_i implementation with three-state multiplexing implemented by transmission gates 200_i and 202_i. The NMOS transistor 196_i connects the capacitor 122_i to the reference input 124_3 (e.g., ground) in the off state. The complement implementation can be obtained by a PMOS transistor connected to the reference input 124_3 (e.g., to a positive supply voltage Vdd).

Figure 12B:
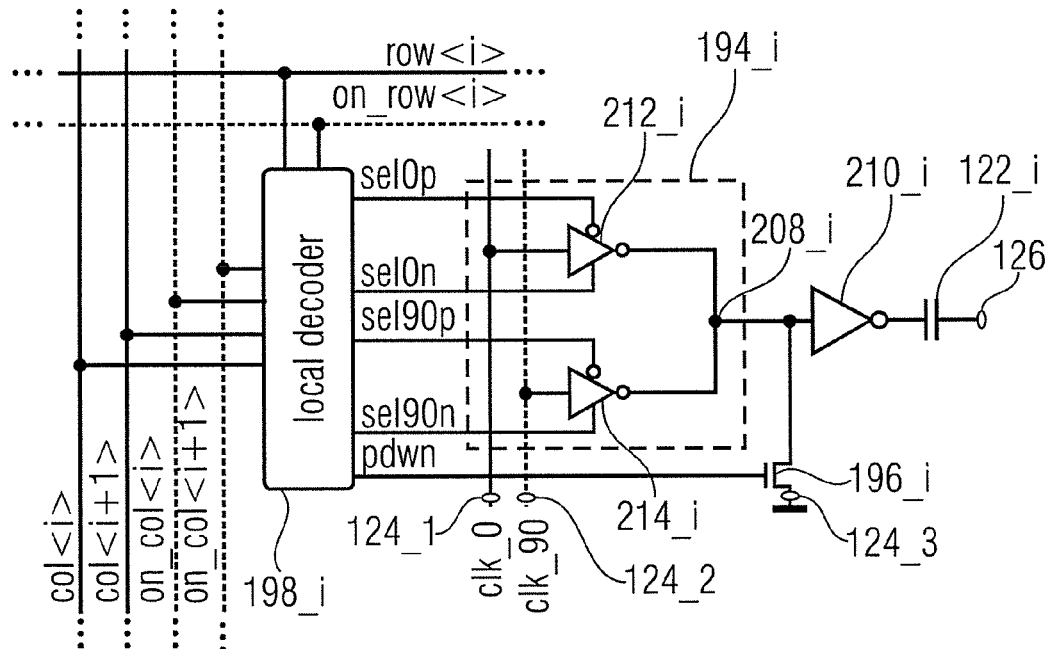
FIG. 12B shows a block diagram of a further implementation of one capacitor cell of the array of capacitor cells shown in FIG. 11.

FIG. 12B shows a further possible implementation of one capacitor cell 140_i of the array of capacitor cells 140_1 to 140_κ shown in FIG. 11. In contrast to FIG. 12A, the multiplexer 194_i can be implemented by a first three-state buffer 212_i configured to connect the capacitor 122_i to the first input 124_1 of the phase interpolator 121 in dependence on the first component sel0p and the second component sel0n of the differential first control signal sel0, and by a second three-state buffer 214_i configured to connect the capacitor 122_i to the second input 124_2 of the phase interpolator 121 in dependence on the first component sel90p and the second component sel90n of the differential second control signal sel90.

Figure 13A:
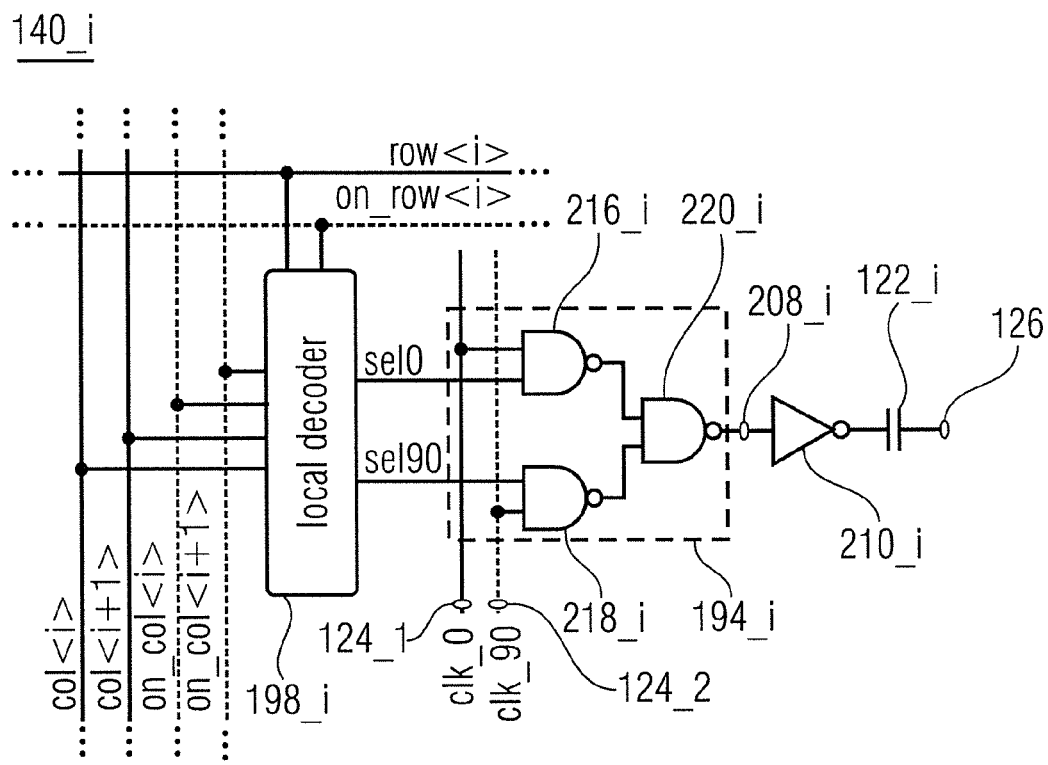
FIG. 13A shows a block diagram of a further implementation of one capacitor cell of the array of capacitor cells shown in FIG. 11.

FIG. 13A shows a further possible implementation of one capacitor cell 140_i of the array of capacitor cells 140_1 to 140_κ shown in FIG. 11.

Figure 13B:
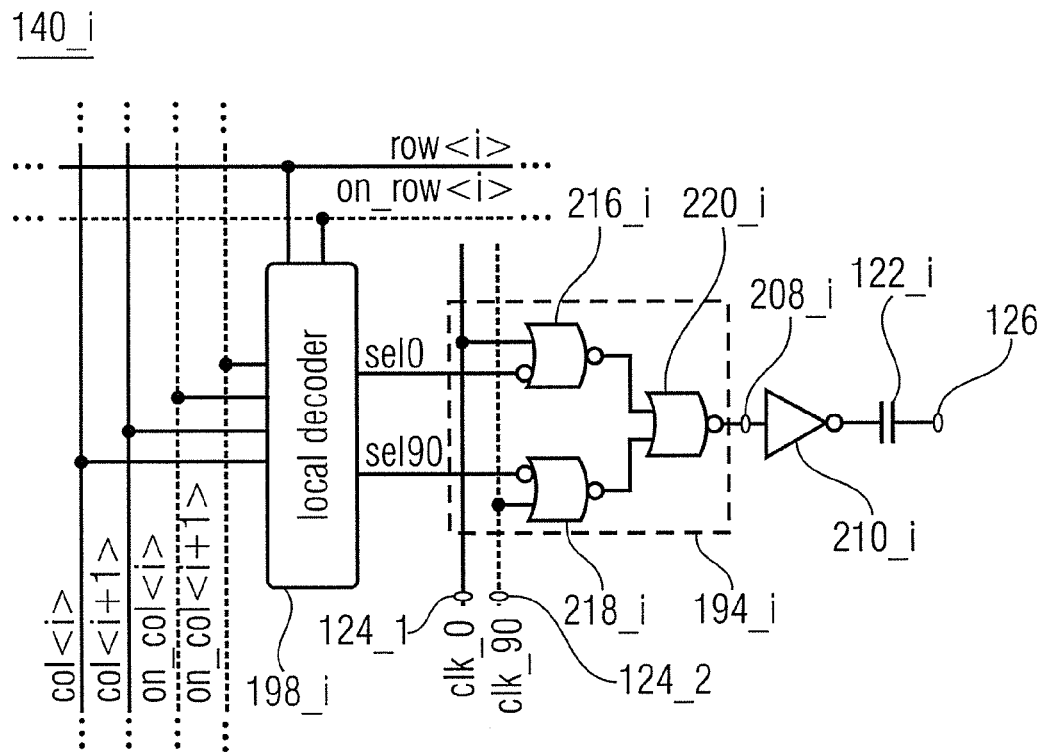
FIG. 13B shows a block diagram of a further implementation of one capacitor cell of the array of capacitor cells shown in FIG. 11.

In contrast to FIGS. 13A and 13B, the capacitor cell 140_i comprises a multiplexer 194 that is configured to connect, dependent on the modulation information 129, the capacitor 122_i of the respective capacitor cell 140_i either to the first input 124_1 of the phase interpolator 121, to the second input 124_2 of the phase interpolator 121 or to the reference input 124_3 (which, in this example is ground) of the phase interpolator 121.

In FIG. 13A, the multiplexer is implemented by a first NAND gate 216_i, a second NAND gate 218_i and a third NAND gate 220_i. A first input of the first NAND gate 216_i can be connected to the local decoder 198_i in order to receive the first control signal sel0, wherein a second input of the first NAND gate 216_i can be connected to the first input 124_1 of the phase interpolator 121 in order to receive the clock signal clk_0. A first input of the second NAND gate 218_i can be connected to the local decoder 198_i in order to receive the second control signal sel90, wherein a second input of the second NAND gate 218_i can be connected to the second input 124_2 of the phase interpolator 121 in order to receive the phase shifted clock signal clk_90. A first input of the third NAND gate 220_i can be connected to an output of the first NAND gate 216_i, wherein a second input of the third NAND gate 220_i can be connected to an output of the second NAND gate 218_i. An output of the third NAND gate 220_i can be connected to the output 208_i of the multiplexer 194_i.

FIG. 13B shows a further possible implementation of one capacitor cell 140_i of the array of capacitor cells 140_1 to 140_κ shown in FIG. 11 (showing, other than FIG. 13A a connection to the reference signal Vdd).

In contrast to FIG. 13A, the multiplexer is implemented by a first NOR gate 216_i, a second NOR gate 218_i and a third NOR gate 220_i. A first input of the first NOR gate 216_i can be connected to the local decoder 198_i in order to receive the first control signal sel0, wherein a second input of the first NOR gate 216_i can be connected to the first input 124_1 of the phase interpolator 121 in order to receive the clock signal clk_0. A first input of the second NOR gate 218_i can be connected to the local decoder 198_i in order to receive the second control signal sel90, wherein a second input of the second NOR gate 218_i can be connected to the second input 124_2 of the phase interpolator 121 in order to receive the phase shifted clock signal clk_90. A first input of the third NOR gate 220_i can be connected to an output of the first NOR gate 216_i, wherein a second input of the third NOR gate 220_i can be connected to an output of the second NOR gate 218_i. An output of the third NOR gate 220_i can be connected to the output 208_i of the multiplexer 194_i.

Figure 14:
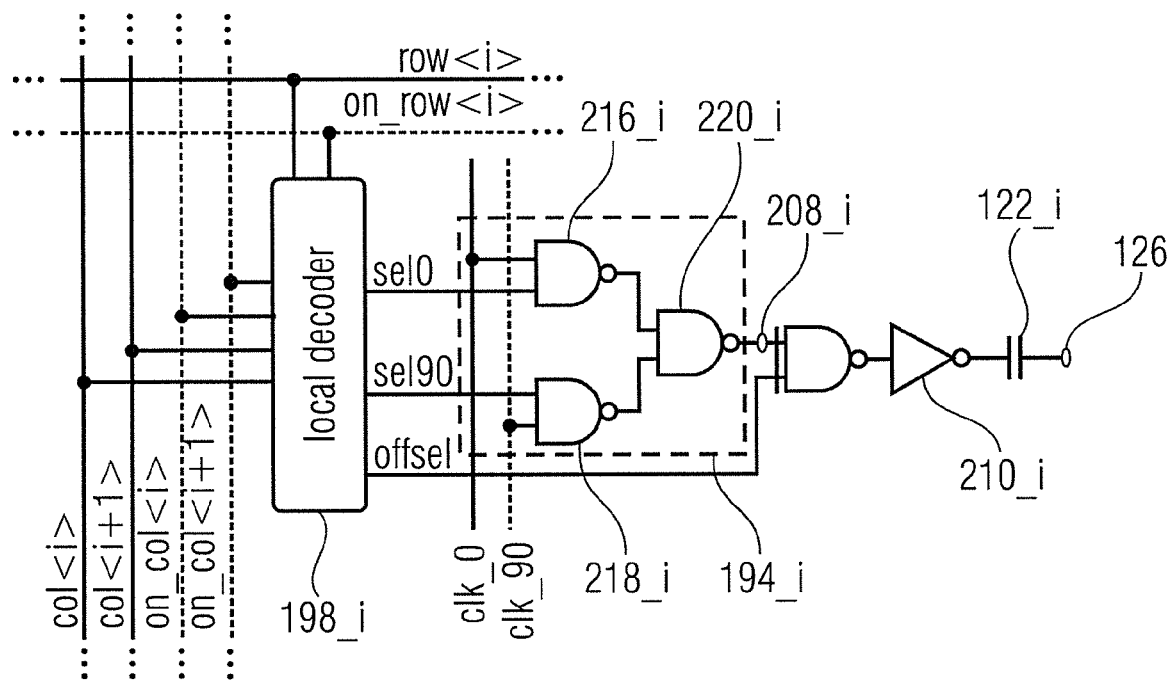
FIG. 14 shows a block diagram of a further implementation of one capacitor cell of the array of capacitor cells shown in FIG. 11.

FIG. 14 shows a further possible implementation of one capacitor cell 140_i of the array of capacitor cells 140_1 to 140_κ shown in FIG. 11.

In contrast to FIGS. 12A and 12B, the multiplexer 194_i is implemented by a first NAND gate 216_i, a second NAND gate 218_i and a third NAND gate 220_i. A first input of the first NAND gate 216_i can be connected to the local decoder 198_i in order to receive the first control signal sel0, wherein a second input of the first NAND gate 216_i can be connected to the first input 124_1 of the phase interpolator 121 in order to receive the clock signal clk_0. A first input of the second NAND gate 218_i can be connected to the local decoder 198_i in order to receive the second control signal sel90, wherein a second input of the second NAND gate 218_i can be connected to the second input 124_2 of the phase interpolator 121 in order to receive the phase shifted clock signal clk_90. A first input of the third NAND gate 220_i can be connected to an output of the first NAND gate 216_i, wherein a second input of the third NAND gate 220_i can be connected to an output of the second NAND gate 218_i. An output of the third NAND gate 220_i can be connected to the output 208_i of the multiplexer 194_i. (a complementary solution may be provided using NOR gates)

Further, in contrast to FIGS. 12A and 12B, the bypass switch 196_i is implemented by an XNOR gate. A first input of the XNOR gate 196_i can be connected to the output 208_i of the multiplexer 194_i, wherein a second input of the XNOR gate 196_i can be connected to the local decoder 198_i in order to receive the third control signal offsel, and wherein an output of the XNOR gate 196_i can be connected to the capacitor 122_i.

In other words, FIG. 14 shows a digital-to-time converter cell 140_i implementation with multiplexing implemented by NAND gates 216_i to 220_i (a complementary solution may be provided using NOR gates). In the switch off state, the capacitor 122_i can be either connected to the positive supply voltage Vdd or to ground by properly driving the XNOR gate 196_i.

Figure 15:
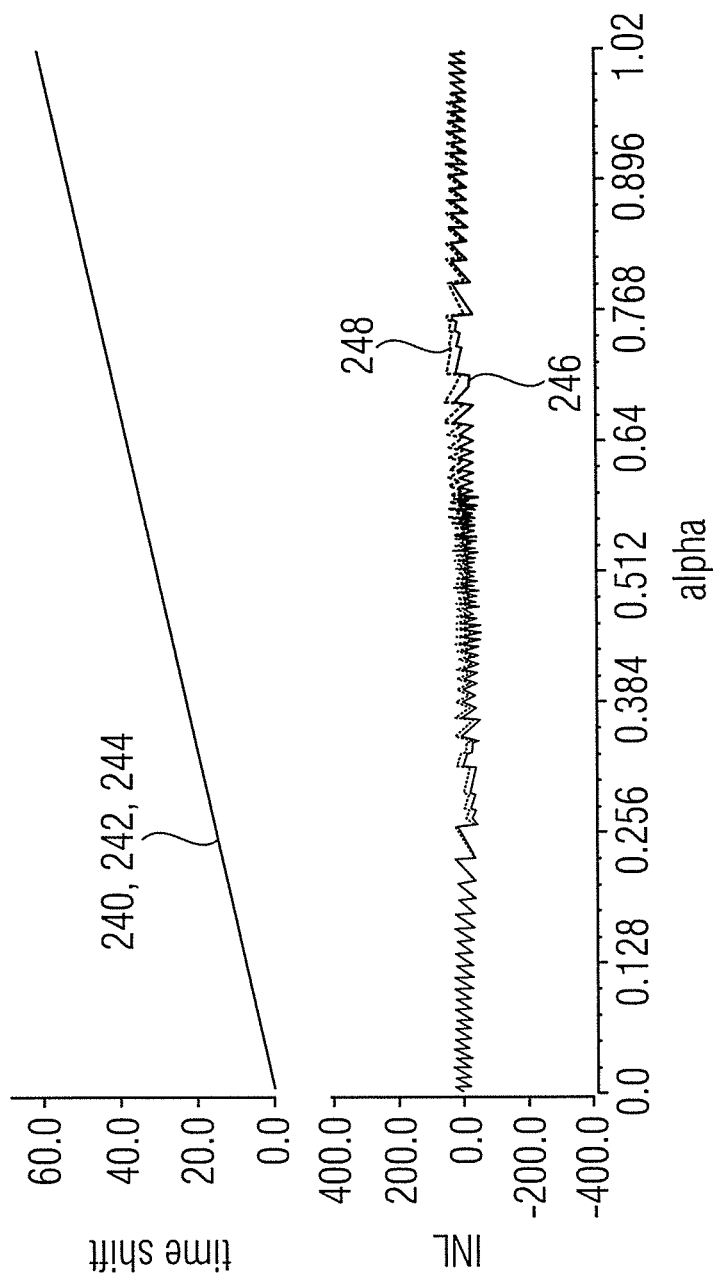
FIG. 15 shows a diagram of time-shifts in ps and integral non-linearities of signals present at the output of the phase interpolator and at the output of the low-pass filter plotted over the modulation code assuming orthogonal clocks at 4 GHz.

FIG. 15 shows a diagram of the time-shift and integral non-linearity (INL) at the output 126 of the phase interpolator 121 and at the output 146 of the low-pass filter 136 plotted over the modulation code α. In other words, FIG. 15 shows time-shift and non-linearity at nodes x and out vs. α for the digital-to-time converter 130 shown in FIG. 7 (based on VerilogA model). Thereby, the ordinate denotes the time shift in ps and the integral non-linearity (INL) in ps assuming orthogonal 4 GHz input phases, where the abscissa denotes the modulation coder a (the number α of capacitors in thousands).

More precisely, in FIG. 15 a first curve 240 indicates an ideal time shift as reference, wherein a second curve 242 indicates the time shift of the modulated phase signal 136 present at the output 146 (node y) of the low-pass filter 134, and wherein a third curve 246 indicates the time shift of the modulated clock signal 144 present at the output 145 (node out) of the digital-to-time converter 130. Further, in FIG. 15 a fourth curve 246 indicates the integral non-linearity (INL) of the modulated phase signal 136 present at the output 146 (node y) of the low-pass filter 134, wherein a fifth curve 246 indicates the integral non-linearity (INL) of the modulated clock signal 144 present at the output 145 (node out) of the digital-to-time converter 130.

As shown in FIG. 15, the first curve 240, the second curve 242 and the third curve 244 are superimposed, such that only one curve is visible. As clear form the bottom plot, the integral non linearity is minimized and only the quantization error is left.

In other words, simulations show that the non-linearity of the digital-to-time converter 130 shown in FIGS. 7, 10 and 11 is reduced (or even minimized). FIG. 15 reports the simulated time-shift and non-linearity (digital-to-time converter cells (capacitor cells 140_1 to 140_κ) are modeled with Verilog-A), featuring 4 GHz input clocks, 10 bits resolution, segmented in 8 thermometer coded bits and 2 binary weighted bits. The integral non-linearity is reduced (or even eliminated) by means of the digital pre-distortion, enabled by the digital-to-time converter unit cell (capacitor cells 140_1 to 140_κ). It can be noticed that, thanks to the constant amplitude sine wave at node y, no additional distortion is introduced by the output buffer 142.

The digital-to-time converter described above is based on phase interpolation enabling digital pre-distortion. The digital-to-time converter unit cell (capacitor cell) in the switch on state is either connected to the clock signal (e.g., a 0° degree clock) or to the phase shifted clock signal (e.g., a 90° shifted clock), otherwise the cell is switched off, i.e. the capacitor is connected to the reference input 124_3 at which, for example, an AC-ground (e.g., a positive supply voltage Vdd or a ground potential) is present.

Further, the above described digital-to-time converter provides a digital pre-distortion of the input digital code (modulation code α), eliminating two main sources of non-linearity. The presented digital pre-distortion can be applied to any kind of digital-to-time converter based on weighted interpolation of two orthogonal phases.

Further, the above described digital-to-time converter provides a capacitor array with multiplexer arranged in an array.

Further, the above described digital-to-time converter provides a phase multiplexer for 360° phase delay and/or phase rotation. Thereby, the digital-to-time converter may comprise a tunable LC filter for improved filtering of fundamental tone.

FIG. 16 shows a flowchart of a method 300 for operating a phase interpolator comprising a plurality of capacitors, a first input for a clock signal, a second input for a phase shifted clock signal, a reference input for a reference signal and an output. The method 300 comprises providing an interpolated, modulated phase information signal by switching, dependent on a modulation information, a first number of the capacitors between the first input and the output, a second number of the capacitors between the second input and the output and a third number of the capacitors to the reference input at 302.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like a microprocessor, a programmable computer or an electronic circuit. Some one or more of the most important method steps may be executed by such an apparatus.

The implementation may be in hardware or in software or may be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. A data carrier may be provided which has electronically readable control signals, which are capable of cooperating with a programmable computer system, such that the method described herein is performed.

The implementation may also be in the form of a computer program product with a program code in a non-transitory medium, the program code being operative for performing the method when the computer program product runs on a computer. The program code may be stored on a machine readable carrier.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. A phase interpolator, comprising:
a plurality of capacitors;
a first input configured to receive a clock signal;
a second input configured to receive a phase shifted clock signal;
a reference input configured to receive a reference signal; and
an output,
wherein the phase interpolator is configured to provide at its output an interpolated, modulated phase information signal by switching, dependent on a modulation information, a first number of the capacitors between the first input and the output, a second number of the capacitors between the second input and the output, and a third number of the capacitors to the reference input.

2. The phase interpolator according to claim 1, wherein the phase interpolator comprises a plurality of inverters, wherein the phase interpolator is configured to connect the first number of the capacitors to the first input via a first number of the inverters, to connect the second number of the capacitors to the second input via a second number of the inverters, and to connect the third number of the capacitors to the reference input via a third number of the inverters.

3. The phase interpolator according to claim 1, wherein the first number of the capacitors, the second number of the capacitors and the third number of the capacitors form the plurality of capacitors.

4. The phase interpolator according to claim 1, wherein the phase interpolator is configured to control or regulate, in response to a change of the modulation information, the first number of the capacitors that are switched between the first input and the output, the second number of the capacitors that are switched between the second input and the output and the third number of the capacitors that are connected to the reference input, such that the change of the modulation information leads to a substantially linear phase shift of a fundamental of the interpolated, modulated phase information signal.

5. The phase interpolator according to claim 1, wherein the phase interpolator is configured to control or regulate, in response to a change of the modulation information, the first number of the capacitors that are switched between the first input and the output, the second number of the capacitors that are switched between the second input and the output, and the third number of the capacitors that are connected to the reference input, such that despite of the change of the modulation information an amplitude of a fundamental of the interpolated, modulated phase information signal is maintained substantially constant.

6. The phase interpolator according to claim 1, wherein each of the plurality of capacitors comprise the same capacitance value.

7. The phase interpolator according to claim 1, wherein the phase interpolator is configured to switch the third number of the capacitors between the reference input and the output.

8. The phase interpolator according to claim 1, wherein the phase shifted clock signal is a phase shifted version of the clock signal.

9. The phase interpolator according to claim 1, wherein the phase interpolator comprises a plurality of capacitor cells, wherein each capacitor cell of the plurality of capacitor cells comprises one capacitor of the plurality of capacitors, wherein each capacitor cell is controlled to connect, dependent on the modulation information, its capacitor either to the first input, to the second input or to the reference input.

10. The phase interpolator according to claim 9, wherein each capacitor cell of the plurality of capacitor cells comprises a multiplexer configured to connect, dependent on the modulation information, the capacitor of the respective capacitor cell either to the first input, to the second input or to the reference input, and a local decoder configured to drive the multiplexer dependent on the modulation information.

11. The phase interpolator according to claim 1, wherein the phase interpolator comprises an array of capacitor cells arranged in lines and columns, wherein each capacitor cell of the array of capacitor cells comprises one capacitor of the plurality of capacitors, wherein each capacitor cell of the plurality of capacitor cells is controlled to connect its capacitor, dependent on the modulation information, either to the first input, to the second input or to the reference input.

12. The phase interpolator according to claim 11, wherein each capacitor cell of the array of capacitor cells comprises a multiplexer configured to connect, dependent on the modulation information, the capacitor of the respective capacitor cell to the first input or to the second input, and a bypass switch configured to connect, dependent on the modulation information, the capacitor of the respective capacitor cell to the reference input.

13. The phase interpolator according to claim 11, wherein each capacitor cell of the array of capacitor cells comprises a multiplexer configured to connect, dependent on the modulation information, the capacitor of the respective capacitor cell either to the first input, to the second input, or to the reference input.

14. The phase interpolator according to claim 11, wherein the phase interpolator is configured to transform the modulation information in a plurality of row control signals and a plurality of column control signals using a thermometer code, and control the capacitor cells with the row control signals and the column control signals.

15. The phase interpolator according to claim 14, wherein each capacitor cell of the array of capacitor cells comprises a local decoder configured to provide a control signal for controlling the respective capacitor cell to connect its capacitor either to the first input, to the second input or to the reference input, dependent on a column control signal of the plurality column control signals and a row control signal of the plurality of row control signals, corresponding to the respective capacitor cell.

16. The phase interpolator according to claim 15, wherein local decoders of capacitor cells of a column having a lower order are further configured to receive a column signal corresponding to a column having a higher order, and override the respective column control signal and the respective row control signal dependent on the column control signal corresponding to the column having the higher order.

17. The phase interpolator according to claim 14, wherein the phase interpolator comprises a column decoder configured to provide the plurality of column control signals based on the modulation information, and a row decoder configured to provide the plurality of row control signals based on the modulation information.

18. A digital-to-time converter, comprising:
a clock signal provider configured to provide a clock signal and a phase shifted clock signal;
a phase interpolator comprising a plurality of capacitors, a first input configured to receive the clock signal, a second input configured to receive the phase shifted clock signal, a reference input configured to receive a reference signal, and an output, wherein the phase interpolator is configured to provide an interpolated, modulated phase information signal by switching, dependent on a modulation information, a first number of the capacitors between the first input and the output, a second number of the capacitors between the second input and the output, and a third number of the capacitors to the reference input; and
a low pass filter configured to low pass filter the interpolated, modulated phase information signal in order to obtain a modulated phase signal.

19. The digital-to-time converter according to claim 18, wherein the digital-to-time converter further comprises a pre-distortion unit configured to receive the modulation information and provide control signals controlling the phase interpolator to switch the first number of the capacitors between the first input and the output, the second number of the capacitors between the second input and the output, and the third number of the capacitors to the reference input.

20. The digital-to-time converter according to claim 19, wherein the pre-distortion unit is configured to control the phase interpolator to vary, in response to a change of the modulation information, the first number of the capacitors that are switched between the first input and the output, the second number of the capacitors that are switched between the second input and the output, and the third number of the capacitors that are connected to the reference input, such that the change of the modulation information leads to a substantially linear phase shift of the modulated phase signal.

21. The digital-to-time converter according to claim 19, wherein the pre-distortion unit is configured to control the phase interpolator to vary, in response to a change of the modulation information, the first number of the capacitors that are switched between the first input and the output, the second number of the capacitors that are switched between the second input and the output, and the third number of the capacitors that are connected to the reference input, such that despite of the change of the modulation information an amplitude of the modulated phase signal is maintained substantially constant.

22. The digital-to-time converter according to claim 18, wherein the clock signal provider comprises a phase multiplexer controlled to provide, dependent on the modulation information, two of at least three clock signals having different phase shifts as the clock signal and the phase shifted clock signal.

23. The digital-to-time converter according to claim 18, wherein the digital-to-time converter comprises an analog-to-digital converter configured to convert the modulated phase signal into a modulated clock signal.

24. A mobile communication device, comprising:
an RF circuit configured to provide or receive RF signals; and
an antenna port coupled to the RF circuit;
wherein the RF circuit comprises a phase interpolator comprising a plurality of capacitors, a first input configured to receive a clock signal, a second input configured to receive a phase shifted clock signal, a reference input configured to receive a reference signal, and an output, wherein the phase interpolator is configured to provide an interpolated, modulated phase information signal by switching, dependent on a modulation information, a first number of the capacitors between the first input and the output, a second number of the capacitors between the second input and the output, and a third number of the capacitors to the reference input.

25. A method for operating a phase interpolator comprising a plurality of capacitors, a first input configured to receive a clock signal, a second input configured to receive a phase shifted clock signal, a reference input configured to receive a reference signal, and an output, the method comprising:
provloging an interpolated, modulated phase information signal by switching, dependent on a modulation information, a first number of the capacitors between the first input and the output, a second number of the capacitors between the second input and the output, and a third number of the capacitors to the reference input.

26. The method according to claim 25, further comprising performing a pre-distortion to receive the modulation information and to provide control signals controlling the phase interpolator to switch the first number of the capacitors between the first input and the output, the second number of the capacitors between the second input and the output, and the third number of the capacitors to the reference input.

27. A non-transitory storage medium having stored thereon a computer program having a program code for performing, when running on a computer or microprocessor, a method for operating a phase interpolator comprising a plurality of capacitors, a first input configured to receive a clock signal, a second input configured to receive a phase shifted clock signal, a reference input configured to receive a reference signal, and an output, the method comprising:
providing an interpolated, modulated phase information signal by switching, dependent on a modulation information, a first number of the capacitors between the first input and the output, a second number of the capacitors between the second input and the output, and a third number of the capacitors to the reference input.

* * * * *